(12) United States Patent
Uzoh et al.

(10) Patent No.: US 12,512,425 B2
(45) Date of Patent: Dec. 30, 2025

(54) EXPANSION CONTROLLED STRUCTURE FOR DIRECT BONDING AND METHOD OF FORMING SAME

(71) Applicant: ADEIA SEMICONDUCTOR BONDING TECHNOLOGIES INC., San Jose, CA (US)

(72) Inventors: Cyprian Emeka Uzoh, San Jose, CA (US); Oliver Zhao, Sunnyvale, CA (US); Bongsub Lee, Santa Clara, CA (US); Laura Wills Mirkarimi, Sunol, CA (US); Dominik Suwito, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 439 days.

(21) Appl. No.: 18/305,149

(22) Filed: Apr. 21, 2023

(65) Prior Publication Data

US 2023/0343734 A1    Oct. 26, 2023

Related U.S. Application Data

(60) Provisional application No. 63/334,580, filed on Apr. 25, 2022.

(51) Int. Cl.
*H01L 23/48* (2006.01)
*H01L 23/00* (2006.01)
(Continued)

(52) U.S. Cl.
CPC .............. *H01L 24/05* (2013.01); *H01L 24/03* (2013.01); *H01L 24/08* (2013.01); *H01L 24/80* (2013.01);
(Continued)

(58) Field of Classification Search
CPC ......... H01L 24/05; H01L 24/03; H01L 24/08; H01L 24/80; H01L 2224/03452;
(Continued)

(56) References Cited

U.S. PATENT DOCUMENTS

| 4,939,568 | A | 7/1990 | Kato et al. |
| 4,998,665 | A | 3/1991 | Hayashi |

(Continued)

FOREIGN PATENT DOCUMENTS

| CN | 1935630 A | 3/2007 |
| CN | 110010546 A | 7/2019 |

(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.

(Continued)

*Primary Examiner* — Niki H Nguyen
(74) *Attorney, Agent, or Firm* — Knobbe, Martens, Olson & Bear, LLP

(57) ABSTRACT

An element, a bonded structure including the element, and a method forming the element and the bonded structure are disclosed. The element can include a non-conductive region having a cavity. The element can include a conductive feature formed in the cavity. The conductive feature includes a center portion and an edge portion having first and second coefficients of thermal expansion respectively. The center and edge portions are recessed relative to a contact surface of the non-conductive region by a first depth and a second depth respectively. The first coefficient of thermal expansion can be at least 5% greater than the second coefficient of thermal expansion. The bonded structure can include the element and a second element having a second non-conduc- (Continued)

tive region and a second conductive feature. A conductive interface between the first and second conductive features has a center region and an edge region. In a side cross-section of the bonded structure, there are more voids at or near the edge region than at or near the center region.

20 Claims, 14 Drawing Sheets

(51) Int. Cl.
*H01L 23/52* (2006.01)
*H01L 29/40* (2006.01)

(52) U.S. Cl.
CPC ............... *H01L 2224/03452* (2013.01); *H01L 2224/03464* (2013.01); *H01L 2224/03614* (2013.01); *H01L 2224/03845* (2013.01); *H01L 2224/05026* (2013.01); *H01L 2224/05073* (2013.01); *H01L 2224/05109* (2013.01); *H01L 2224/05111* (2013.01); *H01L 2224/05147* (2013.01); *H01L 2224/05155* (2013.01); *H01L 2224/05157* (2013.01); *H01L 2224/05163* (2013.01); *H01L 2224/0517* (2013.01); *H01L 2224/05172* (2013.01); *H01L 2224/0518* (2013.01); *H01L 2224/05184* (2013.01); *H01L 2224/05547* (2013.01); *H01L 2224/05555* (2013.01); *H01L 2224/05557* (2013.01); *H01L 2224/05571* (2013.01); *H01L 2224/05609* (2013.01); *H01L 2224/05611* (2013.01); *H01L 2224/05647* (2013.01); *H01L 2224/05655* (2013.01); *H01L 2224/05657* (2013.01); *H01L 2224/05663* (2013.01); *H01L 2224/05666* (2013.01); *H01L 2224/0567* (2013.01); *H01L 2224/0568* (2013.01); *H01L 2224/05681* (2013.01); *H01L 2224/05684* (2013.01); *H01L 2224/08059* (2013.01); *H01L 2224/08145* (2013.01); *H01L 2224/80895* (2013.01); *H01L 2924/01005* (2013.01); *H01L 2924/0132* (2013.01)

(58) Field of Classification Search
CPC . H01L 2224/03464; H01L 2224/03614; H01L 2224/03845; H01L 2224/05073; H01L 2224/05109; H01L 2224/05111; H01L 2224/05147; H01L 2224/05155; H01L 2224/05157; H01L 2224/05163; H01L 2224/0517; H01L 2224/05172; H01L 2224/0518; H01L 2224/05184; H01L 2224/05547; H01L 2224/05555; H01L 2224/05557; H01L 2224/05571; H01L 2224/05611; H01L 2224/05657; H01L 2224/05663; H01L 2224/05666; H01L 2224/0567; H01L 2224/05681; H01L 2224/05684; H01L 2224/08059; H01L 2224/08145; H01L 2224/08095; H01L 2924/01005; H01L 2924/0132; H01L 2224/055554; H01L 2224/451; H01L 2224/48091; H01L 2224/48247; H01L 2224/49171; H01L 23/495; H01L 23/49558; H01L 24/48; H01L 24/49; H01L 2924/00014; H01L 2924/01004; H01L 2924/01019; H01L 2924/01021; H01L 2924/01046; H01L 2924/01057; H01L 2924/01078; H01L 2924/15747; H01L 2924/181; H01L 2924/3011; H01L 21/67011; H01L 21/67132; H01L 2924/0002; H01L 23/12; H01L 2224/73265; H01L 2223/54426; H01L 2224/16; H01L 2224/48465; H01L 2224/8012; H01L 23/13; H01L 23/544; H01L 25/07; H01L 25/18; H01L 2924/10253
See application file for complete search history.

(56) References Cited

U.S. PATENT DOCUMENTS

| | | |
|---|---|---|
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,516,727 A | 5/1996 | Broom |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,660,564 B2 | 12/2003 | Brady |
| 6,667,225 B2 | 12/2003 | Hau-Riege et al. |
| 6,828,686 B2 | 12/2004 | Park |
| 6,837,979 B2 | 1/2005 | Uzoh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,962,835 B2 | 11/2005 | Tong et al. |
| 6,974,769 B2 | 12/2005 | Basol et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,126,212 B2 | 10/2006 | Enquist et al. |
| 7,193,423 B1 | 3/2007 | Dalton et al. |
| 7,354,798 B2 | 4/2008 | Pogge et al. |
| 7,485,968 B2 | 2/2009 | Enquist et al. |

(56) References Cited

U.S. PATENT DOCUMENTS

| | | |
|---|---|---|
| 7,750,488 B2 | 7/2010 | Patti et al. |
| 7,803,693 B2 | 9/2010 | Trezza |
| 7,998,335 B2 | 8/2011 | Feeney et al. |
| 8,039,966 B2 | 10/2011 | Yang et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,735,523 B2 | 8/2023 | Uzoh |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0084414 A1 | 5/2004 | Sakai et al. |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0074040 A1 | 3/2011 | Frank et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0020704 A1 | 1/2013 | Sadaka |
| 2013/0221527 A1 | 8/2013 | Yang et al. |
| 2013/0252399 A1 | 9/2013 | Leduc |
| 2014/0153210 A1 | 6/2014 | Uzoh |
| 2014/0175655 A1 | 6/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0340269 A1 | 11/2015 | Rivoire et al. |
| 2015/0380368 A1 | 12/2015 | Momose et al. |

(56) References Cited

U.S. PATENT DOCUMENTS

| | | |
|---|---|---|
| 2016/0020183 A1 | 1/2016 | Chuang et al. |
| 2016/0133598 A1 | 5/2016 | Baudin et al. |
| 2016/0190103 A1 | 6/2016 | Kabe et al. |
| 2016/0276383 A1 | 9/2016 | Chuang et al. |
| 2016/0343682 A1 | 11/2016 | Kawasaki |
| 2017/0047307 A1 | 2/2017 | Uzoh |
| 2017/0069575 A1 | 3/2017 | Haba et al. |
| 2017/0098627 A1 | 4/2017 | Das et al. |
| 2017/0194271 A1 | 7/2017 | Hsu et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0385982 A1 | 12/2019 | Lee et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1* | 6/2020 | Uzoh .................. H01L 24/82 |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0043557 A1 | 2/2021 | Lee et al. |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0257341 A1* | 8/2021 | Lee .................. H01L 24/32 |
| 2021/0287981 A1 | 9/2021 | Shih |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0005784 A1* | 1/2022 | Gao .................. H01L 24/09 |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0165692 A1 | 5/2022 | Uzoh et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285213 A1 | 9/2022 | Uzoh et al. |
| 2022/0285303 A1 | 9/2022 | Mirkarimi et al. |
| 2022/0302058 A1 | 9/2022 | Gao et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0380145 A1 | 11/2023 | Chen et al. |
| 2024/0006383 A1 | 1/2024 | Lee et al. |
| 2024/0038702 A1 | 2/2024 | Uzoh |

FOREIGN PATENT DOCUMENTS

| | | |
|---|---|---|
| CN | 111095532 A | 5/2020 |
| CN | 217469903 U | 9/2022 |
| JP | 2002-353416 A | 12/2002 |
| JP | 2013-033786 A | 2/2013 |
| JP | 2018-129475 | 8/2018 |
| JP | 2018-160519 | 10/2018 |
| KR | 10-2016-0066272 | 6/2016 |
| TW | 202343661 A | 11/2023 |
| WO | WO 2005/043584 A2 | 5/2005 |
| WO | WO 2019/070571 A1 | 4/2019 |
| WO | WO 2019/241417 A1 | 12/2019 |
| WO | WO 2019/241561 A1 | 12/2019 |
| WO | WO 2019/241571 A1 | 12/2019 |
| WO | WO 2021/236361 A1 | 11/2021 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/

(56) References Cited

OTHER PUBLICATIONS electronica-automotive-power-modules-semi-2018-11/ (published Nov. 8, 2018; downloaded Jul. 26, 2023).
Che, F.X. et al., "Study on Cu protrusion of through-silicon via," IEEE Transactions on Components, Packaging and Manufacturing Technology, May 2013, vol. 3, No. 5, pp. 732-739.
Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.
De Messemaeker, Joke et al., "Correlation between Cu microstructure and TSV Cu pumping," 2014 Electronic Components & Technology Conference, pp. 613-619.
Di Cioccio, L. et al., "An overview of patterned metal/dielectric surface bonding: Mechanism, alignment and characterization," Journal of the Electrochemical Society, 2011, vol. 158, No. 6, pp. P81-P86.
Ganesan, Kousik, "Capable copper electrodeposition process for integrated circuit—substrate packaging manufacturing," A dissertation presented in partial fulfillment of the requirements for the degree Doctor of Philosophy, Arizona State University, May 2018, 320 pages.
Gondcharton, P. et al., "Kinetics of low temperature direct copper-copper bonding," Microsyst Technol, 2015, vol. 21, pp. 995-1001.
Heryanto, A. et al., "Effect of copper TSV annealing on via protrusion for TSV wafer fabrication," Journal of Electronic Materials, 2012, vol. 41, No. 9, pp. 2533-2542.
Hobbs, Anthony et al., "Evolution of grain and micro-void structure in electroplated copper interconnects," Materials Transactions, 2002, vol. 43, No. 7, pp. 1629-1632.
Huang, Q., "Effects of impurity elements on isothermal grain growth of electroplated copper," Journal of the Electrochemical Society, 2018, vol. 165, No. 7, pp. D251-D257.
Huang, Q., "Impurities in the electroplated sub-50 nm Cu lines: The effects of the plating additives," Journal of the Electrochemical Society, 2014, vol. 161, No. 9, pp. D388-D394.
International Search Report and Written Opinion for PCT/US2023/019460, dated Aug. 16, 2023, 9 pages.
Jiang, T. et al., "Plasticity mechanism for copper extrusion in through-silicon vias for three-dimensional interconnects," Applied Physics Letters, 2013, vol. 103, pp. 211906-1-211906-5.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
Kim, Myung Jun et al., "Characteristics of pulse-reverse electrodeposited Cu thin film," I. Effects of Anodic Step in the Absence of an Organic Additives, Journal of the Electrochemical Society, 2012, vol. 159, No. 9, pp. D538-D543.
Kim, Myung Jun et al., "Characteristics of pulse-reverse electrodeposited Cu thin film," II. Effects of Organic Additives, Journal of the Electrochemical Society, 2012, vol. 159, No. 9, pp. D544-D548.
Liu, C. et al., "Low-temperature direct copper-to-copper bonding enabled by creep on (111) surfaces of nanotwinned Cu," Scientific Reports, May 12, 2015, 5:09734, pp. 1-11.
Liu, Chien-Min et al., "Effect of grain orientations of Cu seed layers on the growth of <111>-oriented nanotwinned Cu," Scientific Reports, 2014, vol. 4, No. 6123, 4 pages.
Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.
Lu, L. et al., "Grain growth and strain release in nanocrystalline copper," Journal of Applied Physics, vol. 89, Issue 11, pp. 6408.
Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.
Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.
Moriceau, H. et al., "Overview of recent direct wafer bonding advances and applications," Advances in Natural Sciences—Nanoscience and Nanotechnology, 2010, 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part No. "ONSEMI AR0820.".
Ortleb, Thomas et al., "Controlling macro and micro surface topography for a 45nm copper CMP process using a high resolution profiler," Proc. of SPIE, 2008, vol. 6922, 11 pages.
Parthasaradhy, N.V., "Practical Electroplating Handbook," 1989, Prentice-Hall, Inc., pp. 54-56.
Plobi, A. et al., "Wafer direct bonding: tailoring adhesion between brittle materials," Materials Science and Engineering Review Journal, 1999, R25, 88 pages.
Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

(56) References Cited

OTHER PUBLICATIONS

Takahashi, K. et al., "Transport phenomena that control electroplated copper filling of submicron vias and trenches," Journal of the Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.

* cited by examiner

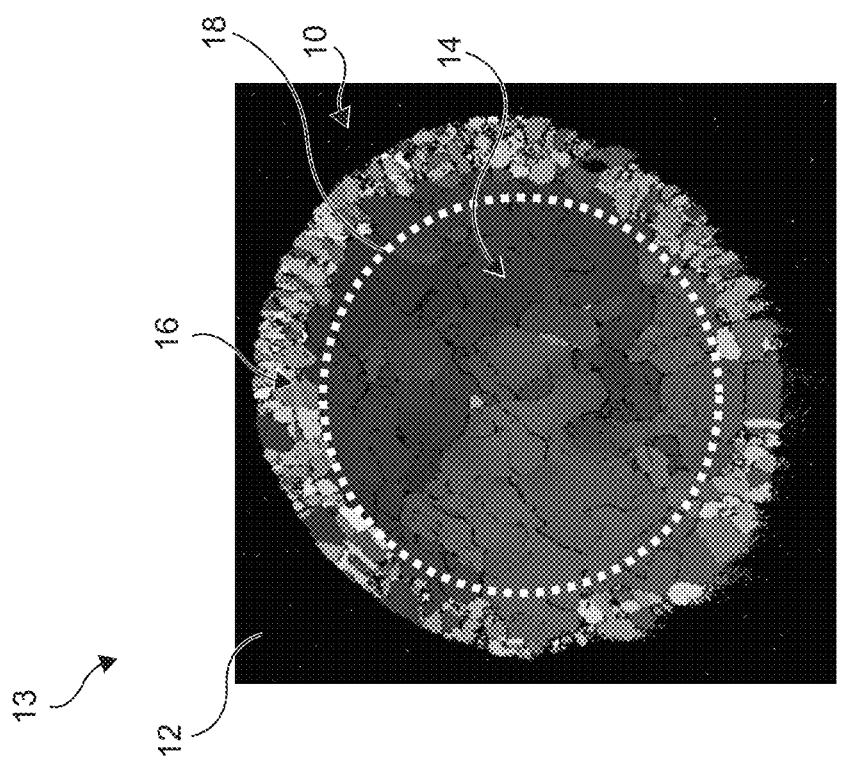
Fig. 2A
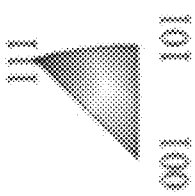
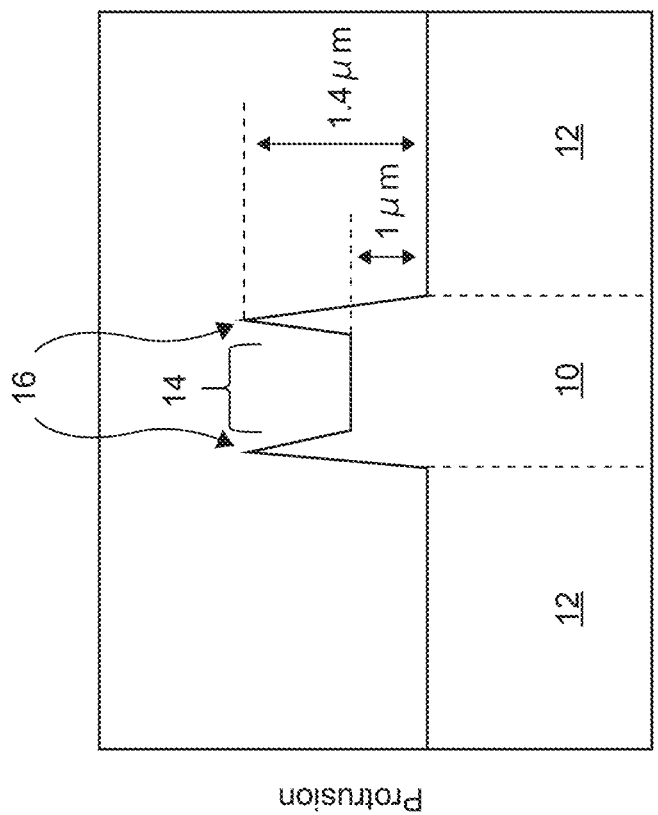
Fig. 2B

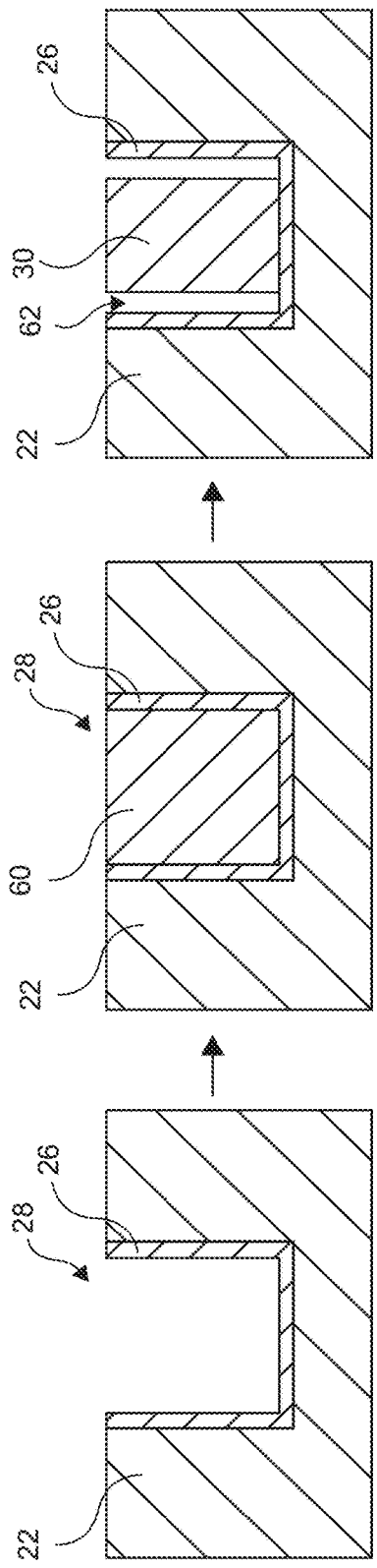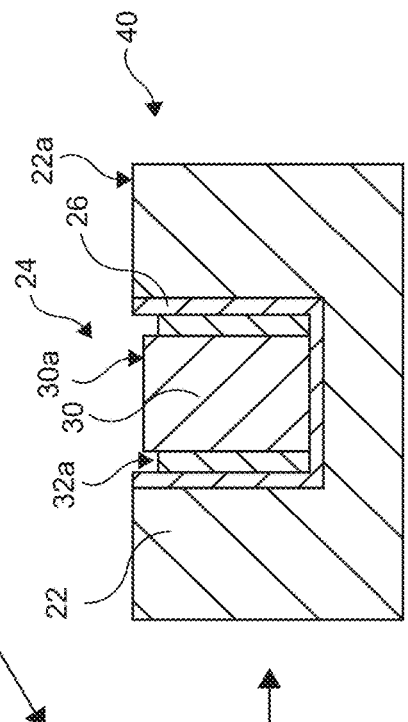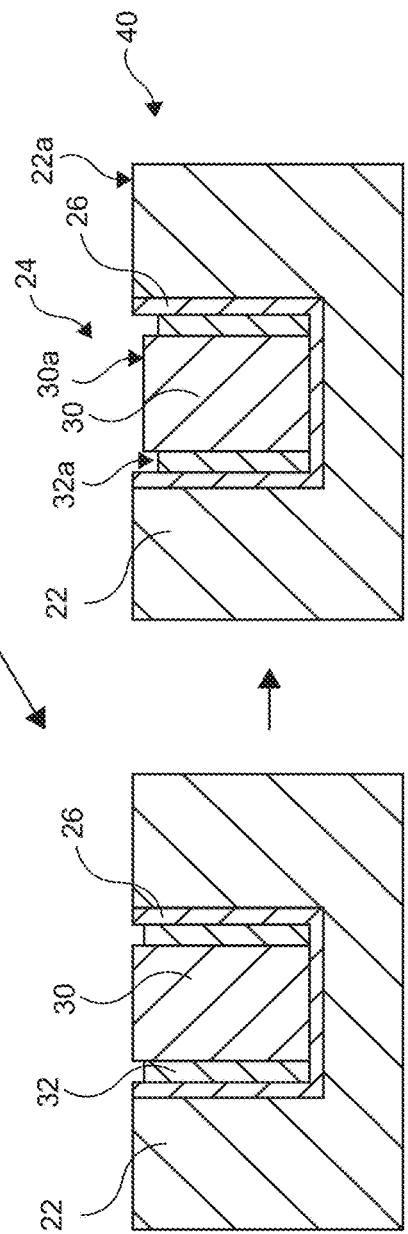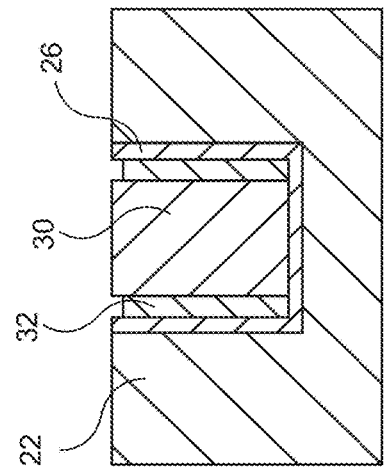

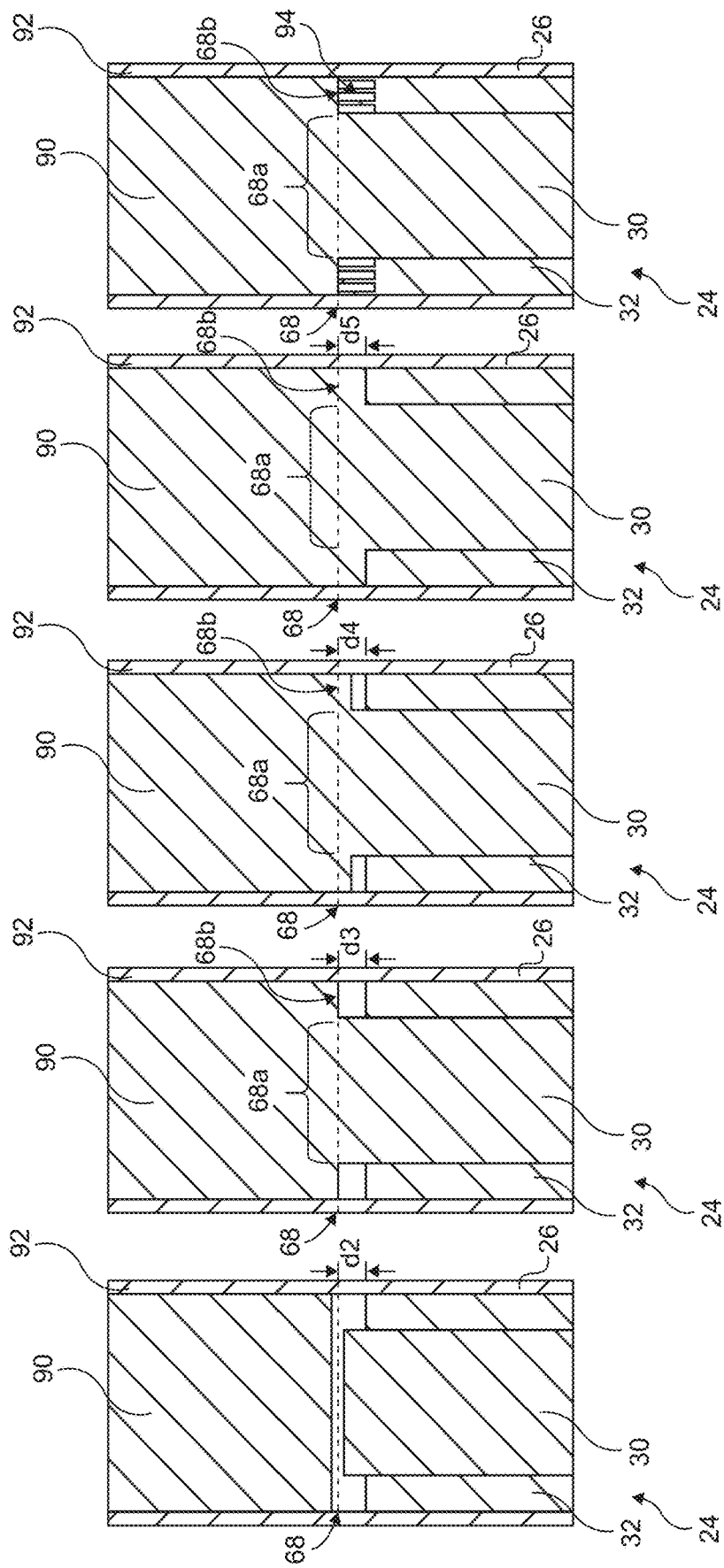

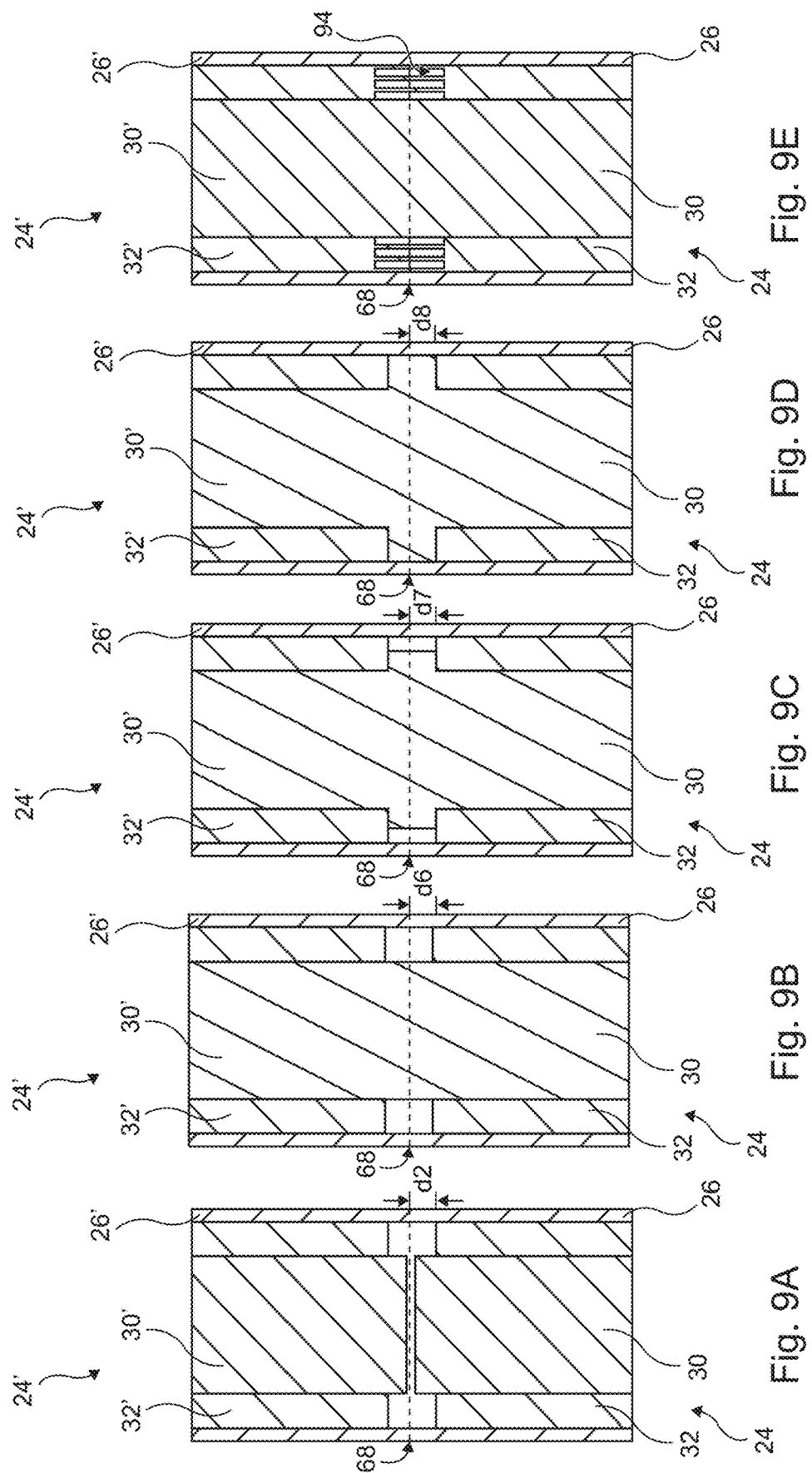

EXPANSION CONTROLLED STRUCTURE FOR DIRECT BONDING AND METHOD OF FORMING SAME

CROSS-REFERENCE TO RELATED APPLICATIONS

This application claims priority to U.S. Provisional Patent Application No. 63/334,580, filed Apr. 25, 2022, the entire contents of which are hereby incorporated by reference herein in their entirety and for all purposes.

BACKGROUND

Field

The field relates to an element prepared for direct bonding and including a conductive feature with controlled expansion.

Description of the Related Art

Semiconductor elements, such as integrated device dies or chips, may be mounted or stacked on other elements. For example, a semiconductor element can be mounted to a carrier, such as a package substrate, an interposer, a reconstituted wafer or element, etc. As another example, a semiconductor element can be stacked on top of another semiconductor element, e.g., a first integrated device die can be stacked on a second integrated device die. Each of the semiconductor elements can have conductive pads for mechanically and electrically bonding the semiconductor elements to one another. There is a continuing need for improved methods for forming the conductive pads for reliable bonding.

BRIEF DESCRIPTION OF THE DRAWINGS

FIG. 2A is a top-down electron back-scatter diffraction (EBSD) image of a copper pad formed in a silicon substrate of an element.

FIG. 2B is a simplified graph showing protruded heights of a cross section of a portion of the element shown in FIG. 2A after annealing.

FIGS. 6A-6E show various steps in a process of manufacturing the element shown in FIG. 4A.

FIG. 8A is a cross-sectional side view of conductive features prior to annealing.

FIGS. 8B-8E are cross-sectional side views of conductive features shown in FIG. 8A after annealing.

FIG. 9A is a cross-sectional side view of conductive features prior to annealing.

FIGS. 9B-9E are cross-sectional side views of conductive features shown in FIG. 9A after annealing.

DETAILED DESCRIPTION

Figure 1A:
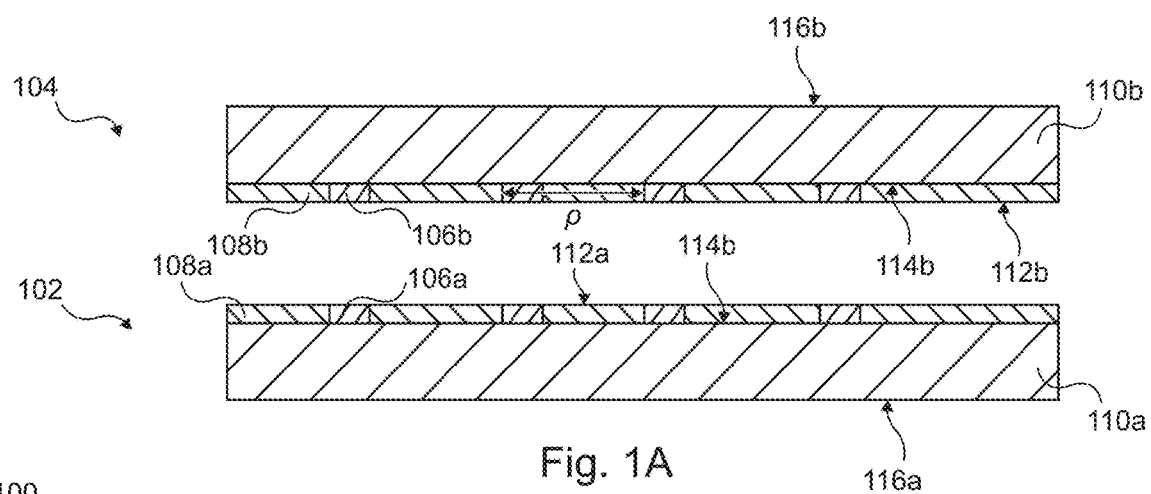
FIG. 1A is a schematic cross-sectional side view of two elements prior to bonding.
Figure 1B:
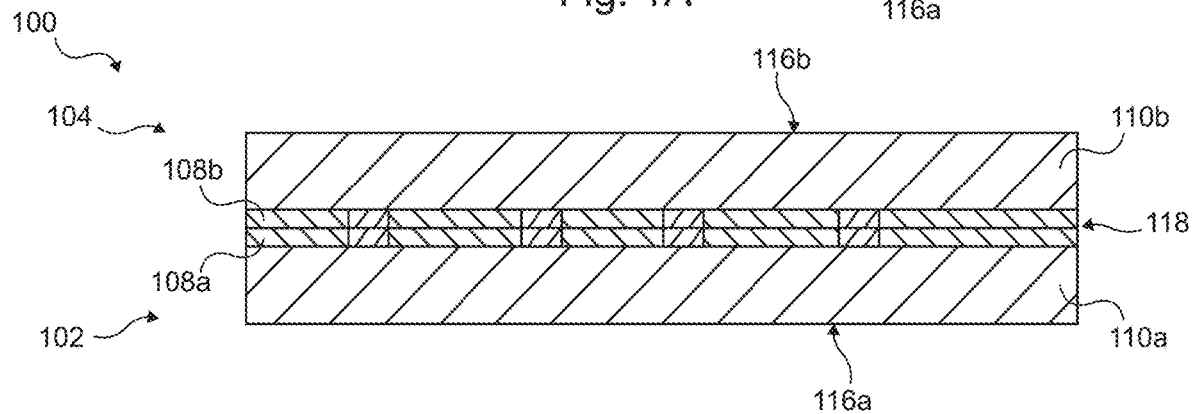
FIG. 1B is a schematic cross-sectional side view of the two elements shown in FIG. 1A after bonding.

Various embodiments disclosed herein relate to directly bonded structures in which two or more elements can be directly bonded to one another without an intervening adhesive. FIGS. 1A and 1B schematically illustrate a process for forming a directly bonded structure without an intervening adhesive according to some embodiments. In FIGS. 1A and 1B, a bonded structure 100 comprises two elements 102 and 104 that can be directly bonded to one another without an intervening adhesive. Two or more semiconductor elements (such as integrated device dies, wafers, etc.) 102 and 104 may be stacked on or bonded to one another to form the bonded structure 100. Conductive features 106a (e.g., contact pads, exposed ends of vias (e.g., TSVs), or a through substrate electrodes) of a first element 102 may be electrically connected to corresponding conductive features 106b of a second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive field region that includes a non-conductive or dielectric material can serve as a first bonding layer 108a of the first element 102 which can be directly bonded to a corresponding non-conductive field region that includes a non-conductive or dielectric material serving as a second bonding layer 108b of the second element 104 without an adhesive. The non-conductive bonding layers 108a and 108b can be disposed on respective front sides 114a and 114b of device portions 110a and 110b, such as a semiconductor (e.g., silicon) portion of the elements 102, 103. Active devices and/or circuitry can be patterned and/or otherwise disposed in or on the device portions 110a and 110b. Active devices and/or circuitry can be disposed at or near the front sides 114a and 114b of the device portions 110a and 110b, and/or at or near opposite backsides 116a and 116b of the device portions 110a and 110b. The non-conductive material can be referred to as a non-conductive bonding region or bonding layer 108a of the first element 102. In some embodiments, the non-conductive bonding layer 108a of the first element 102 can be directly bonded to the corresponding non-conductive bonding layer 108b of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108a and/or 108b can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SICOH dielectrics, silicon carbonitride or diamond-like carbon or a material comprising of a diamond surface. Such carbon-containing ceramic materials can be considered inorganic, despite the inclusion of carbon.

In various embodiments, direct hybrid bonds can be formed without an intervening adhesive. For example, non-conductive bonding surfaces 112a and 112b can be polished to a high degree of smoothness. The bonding surfaces 112a and 112b can be cleaned and exposed to a plasma and/or etchants to activate the surfaces 112a and 112b. In some embodiments, the surfaces 112a and 112b can be terminated with a species after activation or during activation (e.g., during the plasma and/or etch processes). Without being limited by theory, in some embodiments, the activation process can be performed to break chemical bonds at the bonding surfaces 112a and 112b, and the termination process can provide additional chemical species at the bonding surfaces 112a and 112b that improve the bonding energy during direct bonding. In some embodiments, the activation and termination are provided in the same step, e.g., a plasma to activate and terminate the surfaces 112a and 112b. In other embodiments, the bonding surfaces 112a and 112b can be terminated in a separate treatment to provide the additional species for direct bonding. In various embodiments, the terminating species can comprise nitrogen. For example, in some embodiments, the bonding surface(s) 112a, 112b can be exposed to a nitrogen-containing plasma. Further, in some embodiments, the bonding surfaces 112a and 112b can be exposed to fluorine. For example, there may be one or multiple regions of increased fluorine concentration at or near a bonding interface 118 between the first and second elements 102, 104. Thus, in the directly bonded structure 100, the bonding interface 118 between two non-conductive materials (e.g., the bonding layers 108a and 108b) can comprise a very smooth interface with higher nitrogen and/or fluorine content at the bonding interface 118 than within the bonding layers 108a or 108b. In some embodiments, the bonding layers 108a and 108b may comprise nitrogen atoms, after activation and terminations process, oxygen peaks may be disposed at or near a bonding interface 118 between the first and second elements 102, 104. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features 106a of the first element 102 can also be directly bonded to corresponding conductive features 106b of the second element 104. For example, a hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106a to conductive feature 106b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces 112a, 112b (for example, inorganic dielectric surfaces) can be prepared and directly bonded to one another without an intervening adhesive as explained above. Conductive contact features (e.g., conductive features 106a and 106b which may be at least partially surrounded by non-conductive dielectric field regions within the bonding layers 108a, 108b) may also directly bond to one another without an intervening adhesive. In various embodiments, the conductive features 106a, 106b can comprise discrete pads at least partially embedded in the non-conductive field regions. In some embodiments, the conductive contact features can comprise exposed contact surfaces of through substrate vias (TSVs). In some embodiments, the respective conductive features 106a and 106b can be recessed below exterior (e.g., upper) surfaces (non-conductive bonding surfaces 112a and 112b) of the dielectric field region or non-conductive bonding layers 108a and 108b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108a and 108b can be directly bonded to one another without an adhesive at room temperature in some embodiments and, subsequently, the bonded structure 100 can be annealed. Upon annealing, the conductive features 106a and 106b can expand in a direction orthogonal to the bonding surfaces 112a, 112b and contact one another to form a metal-to-metal direct bond. Beneficially, the use of Direct Bond Interconnect, or DBI®, techniques commercially available from Adeia of San Jose, CA, can enable high density of conductive features 106a and 106b to be connected across the direct bond interface 118 (e.g., small or fine pitches for regular arrays). In some embodiments, the pitch of the conductive features 106a and 106b, such as conductive traces embedded in the bonding surface of one of the bonded elements, may be less than 40 microns or less than 10 microns or even less than 2 microns. For some applications, the ratio of the pitch of the conductive features 106a and 106b to one of the dimensions (e.g., a diameter) of the bonding pad is less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 106a and 106b and/or traces can comprise copper, although other metals may be suitable.

Thus, in direct bonding processes, a first element 102 can be directly bonded to a second element 104 without an intervening adhesive. In some arrangements, the first element 102 can comprise a singulated element, such as a singulated integrated device die. In other arrangements, as shown in FIGS. 1A and 1B, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die, as shown in FIGS. 1A and 1B. In other arrangements, the second element 104 can comprise a carrier or substrate (e.g., a wafer). The embodiments disclosed herein can accordingly apply to wafer-to-wafer, die-to-die, or die-to-wafer bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process (e.g., saw markings if a saw singulation process is used).

As explained herein, the first and second elements 102 and 104 can be directly bonded to one another without an adhesive, which is different from a deposition process. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112a and 112b (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolized (OH-terminated) surface with $NH_2$ molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxy-carbonitride, or silicon carbonitride. As explained herein, the direct bond can comprise a covalent bond, which is stronger than van Der Waals bonds. The bonding layers 108a and 108b can also comprise polished surfaces that are planarized to a high degree of smoothness.

In various embodiments, the metal-to-metal bonds between the contact pads 106a and 106b can be joined such that copper grains grow into each other across the bond interface 118. In some embodiments, the copper can have grains oriented along the 111 crystal plane for improved copper diffusion across the bond interface 118. The bond interface 118 can extend substantially entirely to at least a portion of the bonded conductive features 106a and 106b, such that there is substantially no gap between the non-conductive bonding layers 108a and 108b at or near the bonded conductive features 106a and 106b. In some embodiments, a barrier layer may be provided under the conductive features 106a and 106b (e.g., which may include copper). In other embodiments, however, there may be no barrier layer under the conductive features 106a and 106b, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 106a and 106b, and/or small pad sizes. For example, in various embodiments, the pitch p (i.e., the distance from edge-to-edge or center-to-center, as shown in FIG. 1A) between adjacent conductive features 106a (or 106b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

A contact pad can have a center portion that has more highly oriented grains that are generally oriented vertically along the 111 crystal orientation, and an edge portion near or along a sidewall of the cavity that has less oriented grains that are oriented more randomly (e.g., a mixture of the 111, 110, 311, 511, and 100 orientations) without a dominating orientation. The crystal orientation difference can be due to a process (e.g., an electroplating process) for forming the contact pad in a cavity. In such contact pad, before, during, and/or after an annealing process, the edge portion can protrude by a greater distance over the contact surface than the center portion. For example, the edge portion can protrude by a greater distance due to expansion of the contact pad during the annealing process. Uneven protrusion heights across different portions of the contact surface of the conductive structure can induce uneven stresses causing uneven bonding strengths. When the contact pad is bonded to another contact pad, there may be a void formed over the center portion due to the uneven protrusion of the center portion and the edge portion. When the contact pad of the element is bonded to another contact pad of another element with a mismatch (e.g., a lateral offset) between the two contact pads, the edge portion may protrude to push against the other element, which may cause debonding of the two elements and/or a poor electrical connection. Accordingly, a contact pad that has a center portion and an edge portion that protrudes more than the center portion when annealed can hinder reliability of the bond between the contact pad and another pad.

FIG. 2A is a top-down electron back-scatter diffraction (EBSD) image of a copper pad 10 formed in a silicon substrate 12 of an element 13. The copper pad 10 includes a center portion 14 and an edge portion 16 around the center portion 14. In FIG. 2A, a border region 18 between the center portion 14 and the edge portion 16 is shown with a dashed line. The center portion 14 can have grains that are generally oriented vertically (e.g., generally normal to a surface of the conductive feature) along the 111 crystal orientation, and an edge portion has grains that are oriented more randomly (e.g., a mixture of the 111, 110, 311, 511, and 100 orientations) without a dominating orientation. In some embodiments, at least 50% of the grains at the center portion 14 exhibit twins or highly oriented twins. A twin is a type of grain structure in which two or more regions or domains of a crystal lattice are oriented in mirror-image positions relative to each other separated by a twin boundary. For example, the center portion 14 has micro-structure grains that are mostly oriented vertically along the 111 crystal orientation and the edge portion 16 that has nano-structure (e.g., a fine grain structure) grains that are oriented without a dominating orientation. As shown in FIG. 2A, the edge portion 16 can have grains that are oriented in various crystal orientations. The crystal orientation differences between the center portion 14 and the edge portion 16 can be due to a process (e.g., an electroplating process) for forming the conductive feature (e.g., the copper pad 10) in a cavity formed in the silicon substrate 12.

FIG. 2B is a graph showing protruded heights of a cross section of a portion of the element 13 shown in FIG. 2A after annealing. In the graph of FIG. 2B, the heights at different location of the cross section are measured relative to a surface of the silicon substrate 12 prior to annealing at temperatures between 200° C. and 450° C. As shown in the graph of FIG. 2B, the center portion 14 has an average protrusion height of about 1 μm and the edge portion 16 has an average protrusion height of about 1.4 μm. The height difference between the protrusions of the center portion 14 and the edge portion 16 can induce excessive stress. When the copper pad 10 is bonded to another contact pad, there may be voids formed over the center portion 14 due to the uneven protrusion between the center portion 14 and the edge portion 16. When the element 13 is bonded to another element, such excessive stresses and voids can hinder reliability of the bonding between the elements.

Various embodiments disclosed herein relate to controlling heights of protrusions over different locations of a conductive feature in an element formed by an annealing process. The element can include a non-conductive region having a cavity and the conductive feature disposed at least partially in the cavity. The conductive feature can have a center portion and an edge portion. In some embodiments, the edge portion can be disposed at least partially between the center portion and a sidewall of the cavity. For example, the edge portion can be disposed between the center portion and a sidewall of the cavity so as to surround a side surface of the center portion by the edge portion. In some embodiments, a part of the center portion and a part of the edge portion can be exposed on a surface of the conductive feature. For example, the surface of the conductive feature and a surface of the non-conductive region can at least partially define a contact surface of the element.

In some embodiments, heights of the center portion and the edge portion can be controlled to provide a conductive structure that has generally even protrusion heights across the surface of the conductive feature after annealing. For example, the surface of the conductive feature can be recessed relative to the surface of the non-conductive region. The part of the center portion that is exposed on the surface of the conductive feature can be recessed relative to the surface of the non-conductive region by a first depth, and the part of the edge portion that is exposed on the surface of the conductive feature can be recessed relative to the surface of the non-conductive region by a second depth different from the first depth. For another example, the center portion and the edge portion of the conductive feature can comprise the same material with different characteristics (e.g., different coefficient of thermal expansion (CTE), different grain sizes, or different grain orientations), mechanical properties, or different materials. For example, in some embodiments, the center portion can have a material with a first CTE, and the edge portion can comprise a second CTE that is smaller than the first CTE.

Various embodiments disclosed herein relate to a bonded structure that includes the element (a first element) that includes the conductive feature with the controlled center and edge portions, and another element (a second element). The second element can have the same, similar, or different structure as the first element.

Figure 3A:
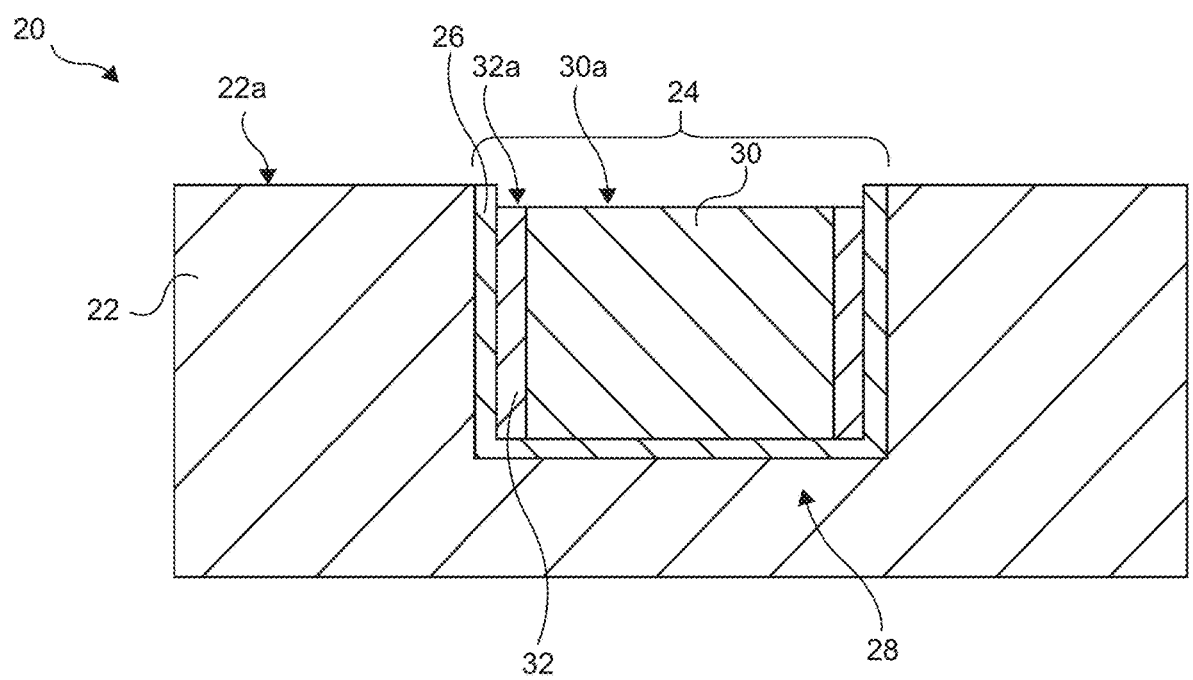
FIG. 3A is a schematic cross-sectional side view of at least a portion of an element according to an embodiment.
Figure 3B:
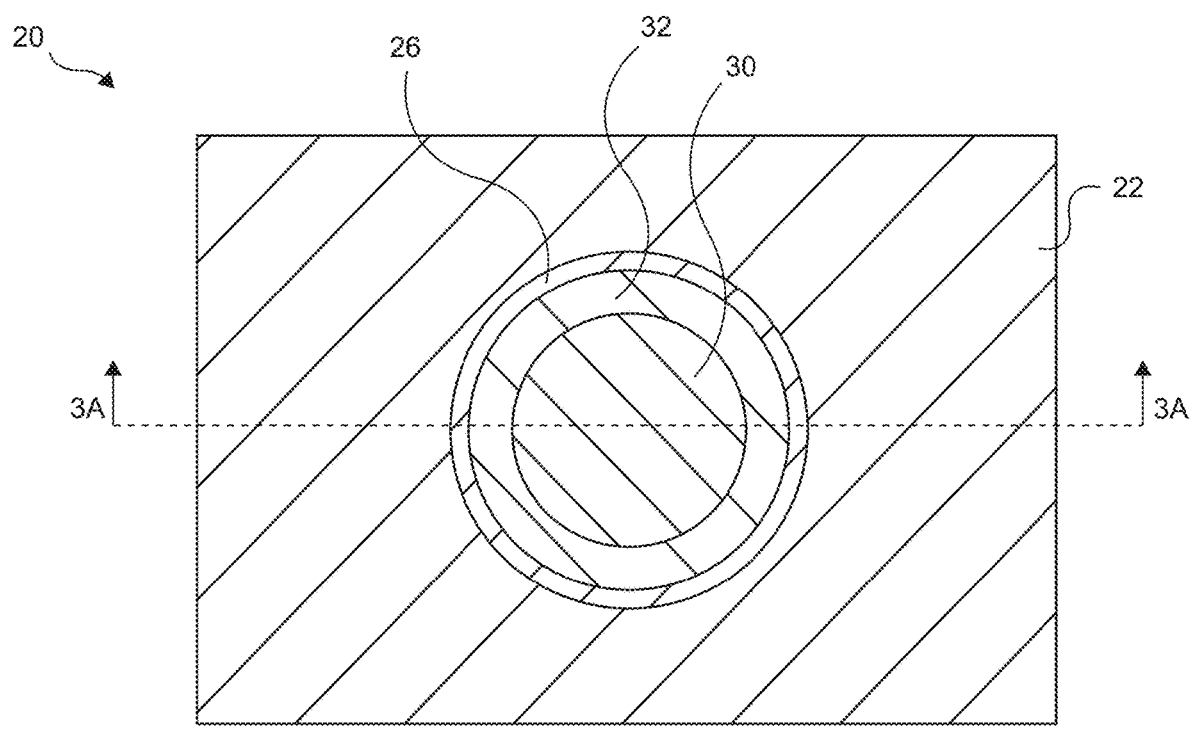
FIG. 3B is a schematic top plan view of the element of FIG. 3A.

FIG. 3A is a schematic cross-sectional side view of at least a portion of an element 20 according to an embodiment. FIG. 3B is a schematic top plan view of the element 20 of FIG. 3A. The element can include a region, such as a non-conductive (e.g., semiconductor or inorganic dielectric) region 22, and a conductive feature 24 (e.g., a contact pad, an exposed end of a via (e.g., TSVs), or a through substrate electrode). In some embodiments, the element 20 can include a barrier layer 26 between the conductive feature 24 and the non-conductive region. For example, the barrier layer 26 can comprise a diffusion barrier layer that prevents or reduces diffusion of the material of the conductive feature 24 into the non-conductive region 22. In some embodiments, the barrier layer 26 can comprise tantalum, titanium, cobalt, nickel, tungsten, or any suitable compound or combinations thereof. In some embodiments, the barrier layer 26 can comprise a multi-layer structure.

The non-conductive region 22 can comprise a dielectric layer. In some embodiments, the non-conductive region 22 may comprise multiple layers of different dielectric materials. For example, the non-conductive region 22 can comprise silicon oxide, silicon nitride, or any other suitable non-conductive bonding material. As shown in FIG. 3A, the cavity 28 can be formed in the non-conductive region 22. The cavity 28 can extend at least partially through a thickness of the non-conductive region 22. For example, the cavity 28 can extend completely through the thickness of the non-conductive region 22. In some embodiments, a dielectric material (not shown) may be disposed between the barrier layer 26 and the non-conductive region 22.

The non-conductive region 22 has a contact surface 22a that can at least partially define a bonding surface of the element 20. The contact surface 22a of the non-conductive region 22 can be prepared for direct bonding as explained herein. In some embodiments, the contact surface 22a can be polished by way of, for example, chemical mechanical polishing (CMP), to have a surface roughness of less than 15 Å rms, less than 10 Å rms, or less than 5 Å rms.

The conductive feature 24 can comprise a first portion (e.g., a center portion 30) and a second portion (e.g., an edge portion 32). A part (e.g., an upper surface 30a) of the center portion 30 and a part (e.g., an upper surface 32a) of the edge portion 32 can at least partially define the bonding surface of the element 20. The upper surface 30a of the center portion 30 and the upper surface 32a of the edge portion 32 can be recessed relative to the contact surface 22a of the non-conductive region 22 by a first depth. For example, the upper surface 30a of the center portion 30 and the upper surface 32a of the edge portion 32 can be recessed by less than 30 nm, less than 20 nm, less than 15 nm, or less than 10 nm, for example, recessed in a range of 2 nm to 20 nm, or in a range of 4 nm to 10 nm.

In some embodiments, the center portion 30 and the edge portion 32 of the conductive feature 24 can have different material properties. For example, the center portion 30 and the edge portion 32 of the conductive feature 24 can have the same base material with different material properties or alloys, or different materials. In some embodiments, the center portion 30 has a first coefficient of thermal expansion (CTE), and the edge portion 32 has a second CTE different from the first CTE. For example, the first CTE can be greater than the second CTE. In some embodiments, the first CTE can be at least 5% greater than the second CTE. For example, the first CTE can be 5% to 50%, 10% to 50%, 20% to 50%, 5% to 40%, 5% to 30%, or 10% to 40% greater than the second CTE. In some embodiments, the center portion 30 and/or the edge portion 32 can comprise nickel vanadium (NiV) or nickel boride (NiB). The NiV or NiB can be formed by way of plating or sputtering, in some embodiments. The center portion 30 and/or the edge portion 32 can comprise copper zirconium (CuZr), copper indium (CuIn), copper tin (CuSn), copper molybdenum (CuMo), or copper vanadium (CuV) with, for example, less than 50% alloy. The center portion 30 and/or the edge portion 32 can comprise an alloy of copper (Cu) with nickel (Ni), cobalt (Co), vanadium (V), tungsten (W), zirconium (Zr), or molybdenum (Mo). The center portion 30 and/or the edge portion 32 can comprise an alloy of Co with Ni, V, W, Zr, or Mo. For example, the Cu or Co alloy can comprise less than 5% of Ni, Co, V, W, Zr, or Mo. The center portion 30 and/or the edge portion 32 can comprise a nano-twin metal (e.g., nano-twin copper), or a fine grain metal (e.g., fine grain copper). Using the nano-twin metal having the 111 crystal orientation can be advantageous in some applications as the 111 nano-twin metal can have a relatively low CTE, a relatively high hardness, and a relatively high electromigration resistance. The fine grain metal can be defined as a metal having an average grain width less than 20 nm, less than 50 nm, less than 100 nm, less than 300 nm, or less than 500 nm. For example, the maximum width of grain in the fine grain metal can be in a range of 10 nm to 500 nm, 10 nm to 300 nm, 20 nm to 500 nm, 20 nm to 300 nm, 20 nm to 100 nm, 20 nm to 50 nm, 50 nm to 500 nm, 50 nm to 300 nm, or 100 nm to 300 nm. The center portion 30 and/or the edge portion 32 can comprise a metal that has grains generally oriented vertically (e.g., generally normal to a surface of the conductive feature) along the 111 crystal orientation.

In some embodiments, the materials of the center portion 30 and the edge portion 32 can be selected such that the protrusion height of the center portion 30 is the same, generally similar to, or greater than the protrusion height of the edge portion 32, after annealing, such that, after annealing and bonding, a generally uniform bond interface can be formed. The center portion 30 and the edge portion 32 can be annealed at a temperature in a range between 100° C. and 400° C., 100° C. and 300° C., 100° C. and 250° C., 150° C. to 400° C., 150° C. to 300° C., or 180° C. to 300° C., for any suitable duration, e.g., a duration in a range between 60 to 180 minutes. In some embodiments, the annealing temperature can vary based at least in part on a size of the conductive feature 24. For example, the conductive feature 24 with a smaller size (e.g., diameter) can be annealed at a higher temperature than the conductive feature 24 with a larger size (e.g., diameter). For example, the conductive feature 24 with the larger diameter can protrude more than the conductive feature 24 with the smaller diameter with the same annealing temperature. The conductive feature 24, such as a contact pad, an exposed end of a via (e.g., a TSV), or a through substrate electrode of embodiments described herein can have a maximum size (e.g., a maximum lateral dimension or diameter) in a range between about 0.01 μm and 15 μm, between about 0.1 μm and 10 μm, between about 0.5 μm and 8 μm, between about 2 μm and 5 μm, between about 1 μm and 3 μm, or between about 0.01 μm and 1 μm. A difference between an average height of the center portion 30 and an average height of the edge portion 32 after annealing can be less than 0.2 μm, less than 0.1 μm, or less than 0.05 μm. In some embodiments, the center portion 30 and the edge portion 32 can be selected such that the first CTE of the center portion 30 is the same as or greater than the second CTE of the edge portion 32.

The center portion 30 and the edge portion 32 with materials and/or dimensions selected as disclosed herein can enable the conductive feature 24 to reliably bond to another conductive feature of another element with a sufficient bonding strength and with resulting minimal stress and/or voids. FIGS. 4A-5D illustrate elements according to various embodiments that can implement any one or more of suitable principles and/or advantages disclosed herein, such as those described with respect to FIGS. 3A-3B.

Figures 4A, 4B:
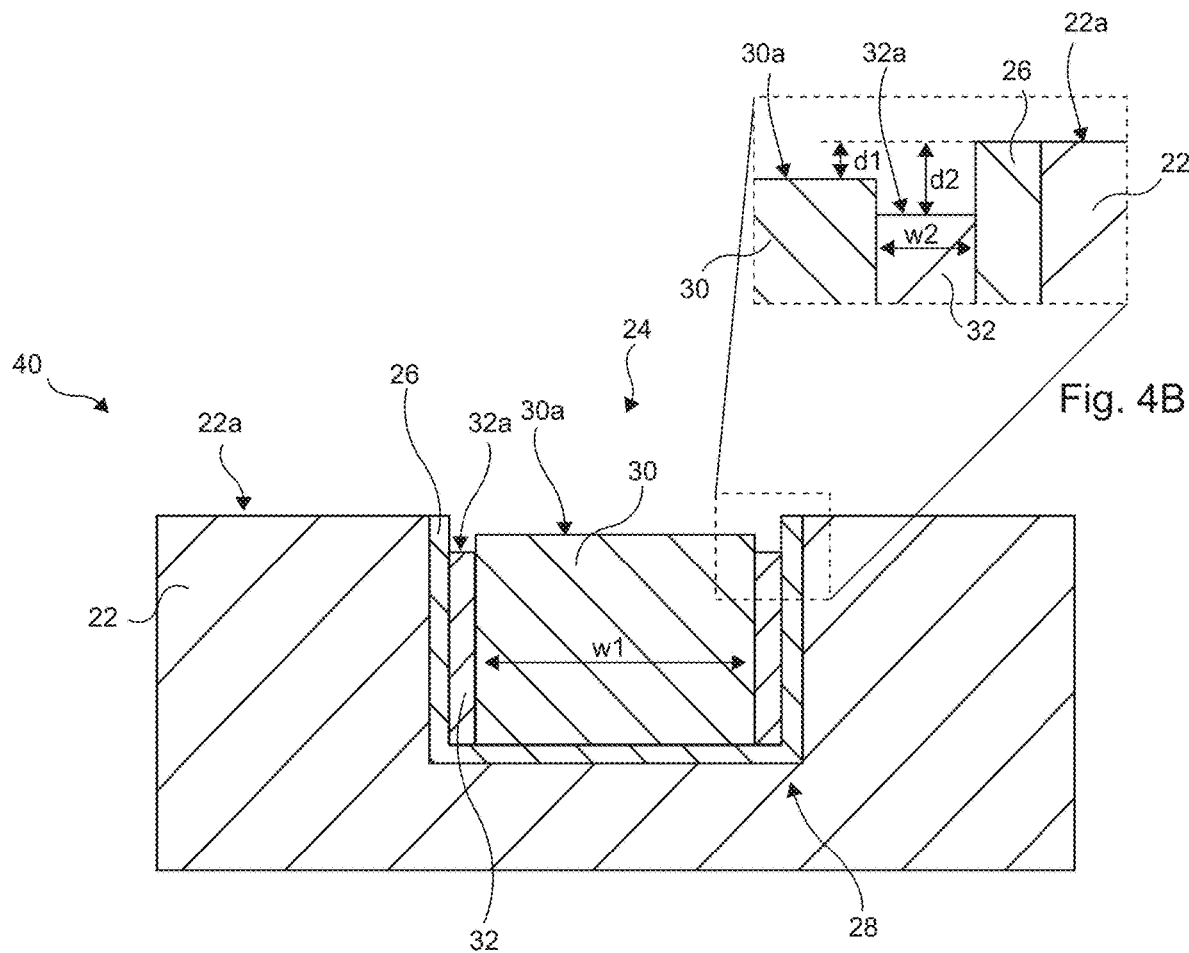
FIG. 4A is a schematic cross-sectional side view of an element according to an embodiment.
FIG. 4B is a close-up view of a portion of the element shown in FIG. 4A.

FIG. 4A is a schematic cross-sectional side view of an element 40 according to an embodiment. FIG. 4B is a close-up view of a portion of the element 40 shown in FIG. 4A. Unless otherwise noted, components of FIGS. 4A and 4B can be the same as or generally similar to the like components disclosed herein, such as those shown in FIGS. 3A-3B. The element 40 is generally similar to the element 20 shown in FIGS. 3A-3B, except that, in the element 40, the upper surface 32a of the edge portion 32 is recessed below the upper surface 30a of the center portion 30. The upper surface 30a of the center portion 30 can be recessed relative to the contact surface 22a of the non-conductive region 22 by a first depth d1, and the upper surface 32a of the edge portion 32 can be recessed relative to the contact surface 22a of the non-conductive region 22 by a second depth d2 that is greater than the first depth d1. Though the barrier layer 26 and the contact surface 22a of the non-conductive region 22 are shown as being flush without any recess, the barrier layer 26 may be recessed relative to the contact surface 22a, in some embodiments.

The first and second depths d1, d2 of the center and edge portions 30, 32 can be selected based on various factors to enable the center and edge portions 30, 32 to have desired protrusion heights after annealing. For example, the first and second depths d1, d2 of the center and edge portions 30, 32 can be selected based at least in part on the materials of the center and edge portions 30, 32, a width w1 of the center portion 30, a width w2 of the edge portion, the annealing temperature, and/or a CTE difference between the conductive feature 24 and the non-conductive region 22. In some embodiments, the edge portion 32 may comprise a material with a higher CTE than a material of the center portion 30, and the greater second depth d2 relative to the first depth d1 can compensate for the CTE difference so as to prevent or mitigate the edge portion 32 to protrude excessively compared to the center portion 30 after annealing.

In some embodiments, the difference between the first and second depths d1, d2 can be in a range between 0.01 μm and 0.5 μm, 0.1 μm and 0.5 μm, 0.1 μm and 0.4 μm, 0.2 μm and 0.5 μm, or 0.2 μm and 0.4 μm for deep cavities (e.g., the cavity 28 with a depth of 10 μm to 100 μm) such as in some TSV or other thru substrate electrode structures. In some embodiments, the upper surface 30a of the center portion 30 can be recessed relative to the contact surface 22a of the non-conductive region 22, for example, by less than 100 nm, less than 50 nm, less than 20 nm, or less than 10 nm, for example, recessed in a range between 2 nm and 20 nm, or in a range between 4 nm and 10 nm.

Figure 4C:
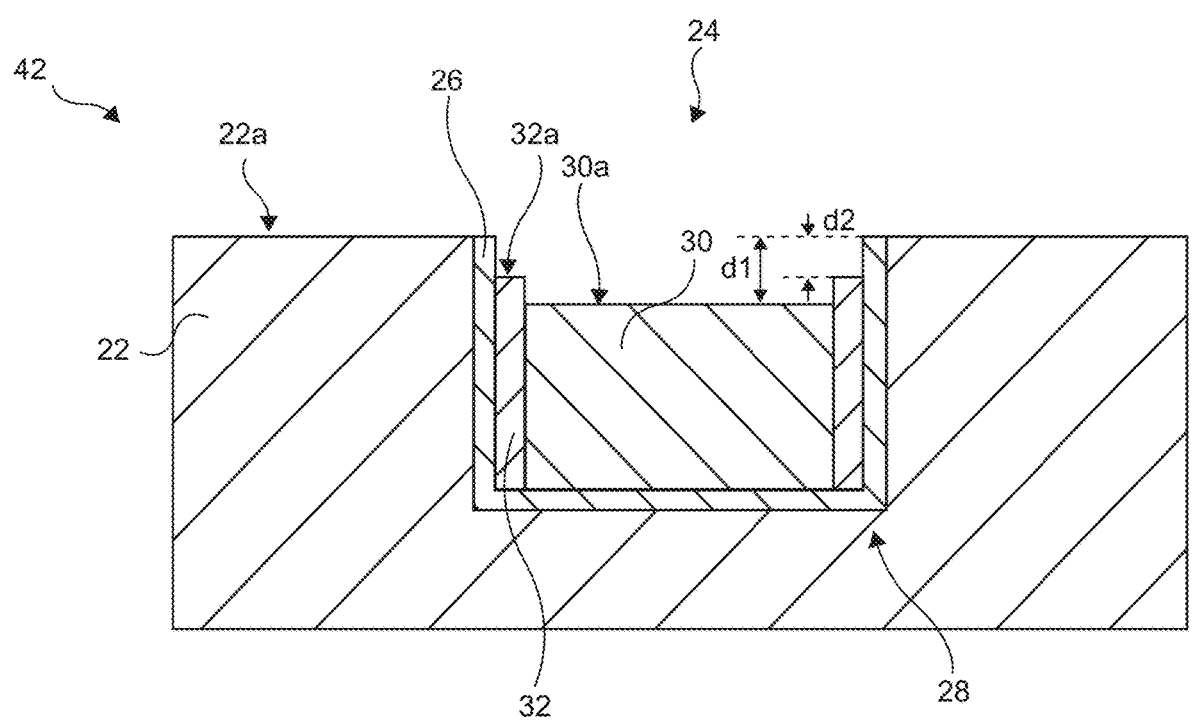
FIG. 4C is a schematic cross-sectional side view of an element according to an embodiment.

FIG. 4C is a schematic cross-sectional side view of an element 42 according to an embodiment. Unless otherwise noted, components of FIG. 4C can be the same as or generally similar to the like components disclosed herein, such as those shown in FIGS. 3A-4B. The element 42 is generally similar to the elements 20, 40 shown in FIGS. 3A-4B, except that, in the element 42, the upper surface 30a of the center portion 30 is recessed below the upper surface 32a of the edge portion 32. In other words, the first depth d1 can be greater than the depth d2.

The first and second depths d1, d2 of the center and edge portions 30, 32 can be selected based on various factors to enable the center and edge portions 30, 32 to have desired protrusion heights after annealing, so as to generate sufficient forces for bonding without causing damage to the elements or debonding. For example, the first and second depths d1, d2 of the center and edge portions 30, 32 can be selected based at least in part on the materials of the center and edge portions 30, 32, a width w1 of the center portion 30, a width w2 of the edge portion, the annealing temperature, and/or a CTE difference between the conductive feature 24 and the non-conductive region 22. In some embodiments, the edge portion 32 may comprise a material with a lower CTE than a material of the center portion 30, and the greater first depth d1 relative to the second depth d2 can compensate for the CTE difference so as to prevent or mitigate the center portion 30 to protrude excessively compared to the edge portion 32 after annealing.

Figure 5A:
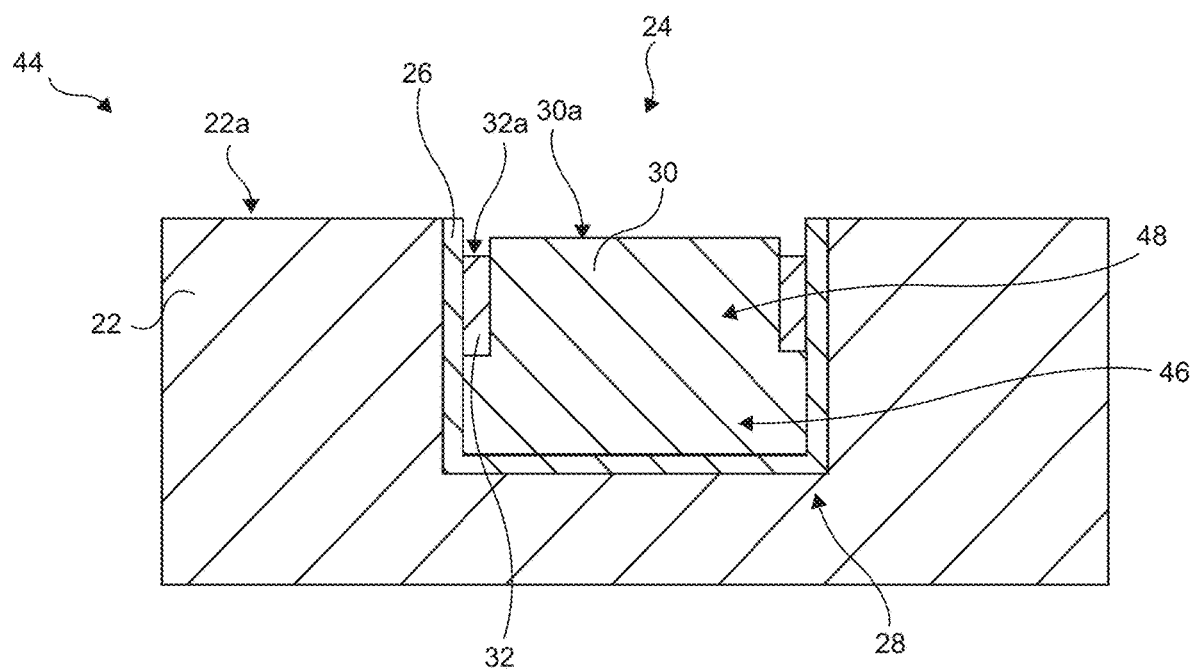
FIG. 5A is a schematic cross-sectional side view of an element according to an embodiment.

FIG. 5A is a schematic cross-sectional side view of an element 44 according to an embodiment. Unless otherwise noted, components of FIG. 5A can be the same as or generally similar to the like components disclosed herein, such as those shown in FIGS. 3A-4C. The element 44 is generally similar to the elements 40, 42 shown in FIGS. 4A-4C. In the element 44, the center portion 30 includes a bottom region 46 and an upper region 48 over the bottom region 46. The edge portion 32 can be positioned such that the edge portion 32 is disposed between the upper region 48 of the center portion 30 and the sidewall of the cavity 28.

Figure 5B:
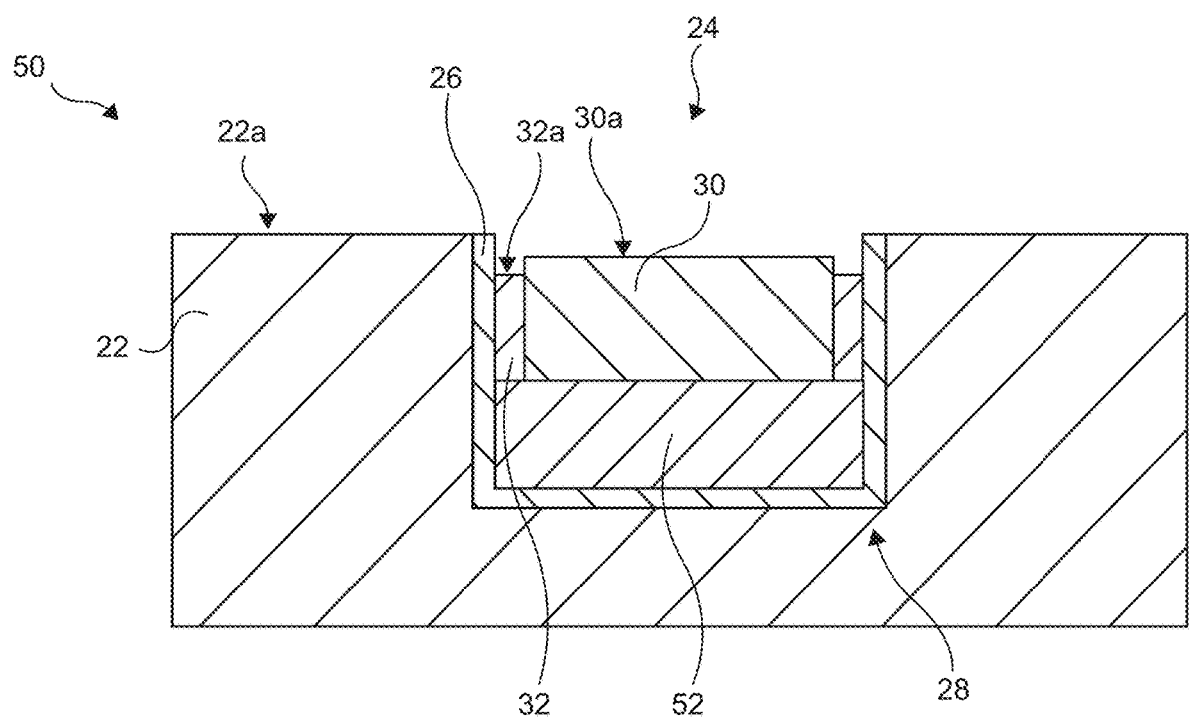
FIG. 5B is a schematic cross-sectional side view of an element according to an embodiment.

FIG. 5B is a schematic cross-sectional side view of an element 50 according to an embodiment. Unless otherwise noted, components of FIG. 5B can be the same as or generally similar to the like components disclosed herein, such as those shown in FIGS. 3A-4C. The element 50 is generally similar to the elements 40, 42, 44 shown in FIGS. 4A-5A. In the element 50, the conductive feature 24 can include the center portion 30, the edge portion 32, and a bottom portion 52. The bottom portion 52 can comprise the same material as the center portion 30 and/or the edge portion 32 with different material properties, or a different material from the material(s) of the center portion 30 and/or the edge portion 32.

Figure 5C:
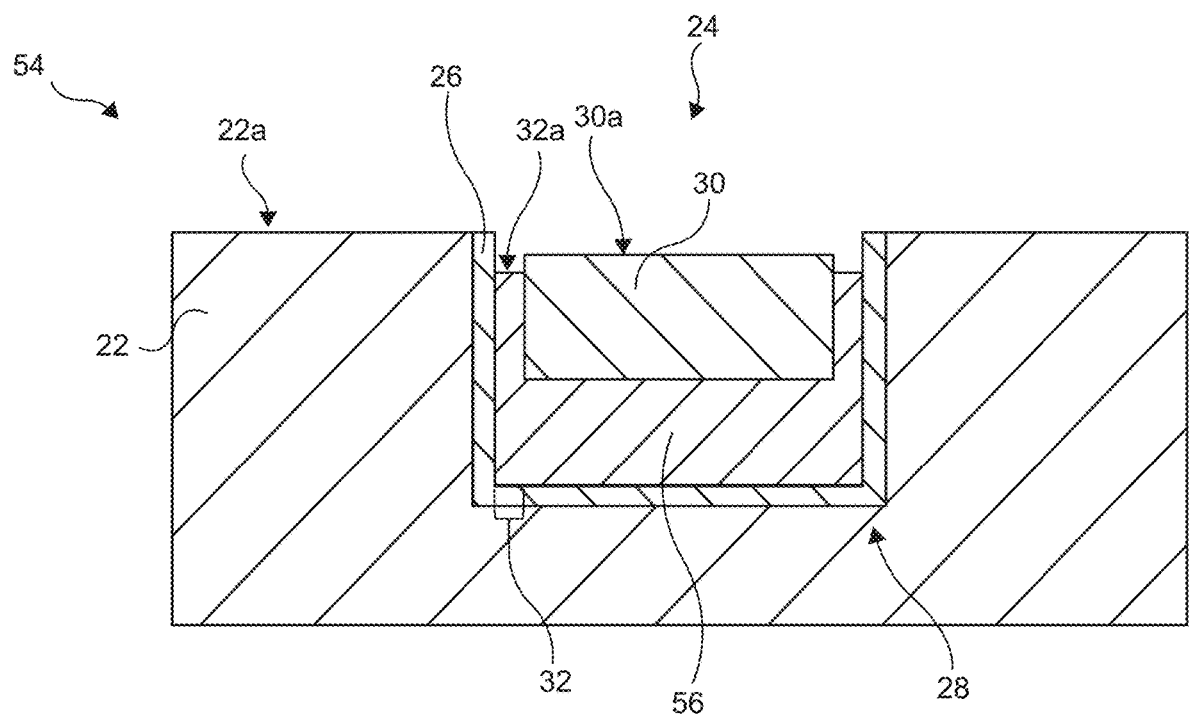
FIG. 5C is a schematic cross-sectional side view of an element according to an embodiment.

FIG. 5C is a schematic cross-sectional side view of an element 54 according to an embodiment. Unless otherwise noted, components of FIG. 5C can be the same as or generally similar to the like components disclosed herein, such as those shown in FIGS. 3A-5B. The element 54 is generally similar to the element 40 shown in FIGS. 4A-4B. In some embodiments, the edge portion 32 of the element 54 can be a portion of a conductive material 56 disposed in the cavity 28 that is different from the center portion 30.

Figure 5D:
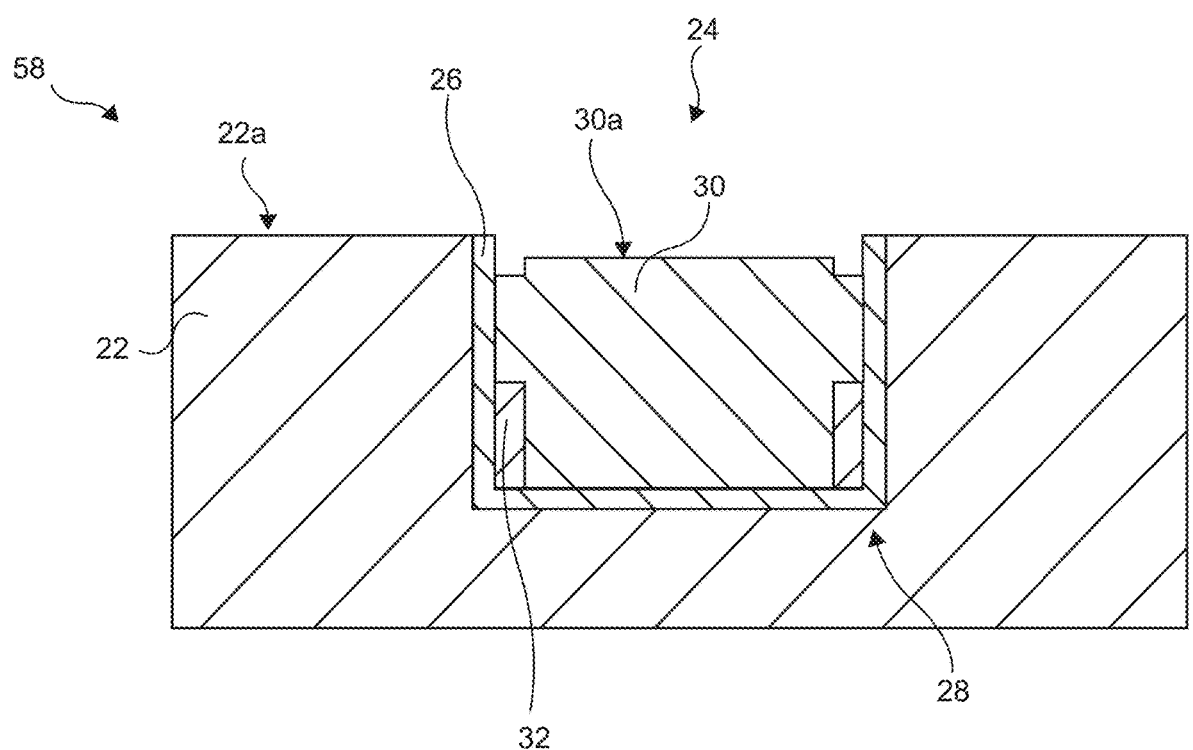
FIG. 5D is a schematic cross-sectional side view of an element according to an embodiment.

FIG. 5D is a schematic cross-sectional side view of an element 58 according to an embodiment. Unless otherwise noted, components of FIG. 5D can be the same as or generally similar to the like components disclosed herein, such as those shown in FIGS. 3A-5C. The element 58 is generally similar to the element 40 shown in FIGS. 4A-4B. In some embodiments, the edge portion 32 can be at least partially buried in the center portion 30.

Any suitable combinations of features disclosed herein can be implemented to form an element. For example, various features of the conductive feature 24 can be implemented to form an element that can provide reliable bonding when bonded to another embodiment.

FIGS. 6A-6E show various steps in a process of manufacturing the element 40 shown in FIG. 4A. Processes similar to the process of FIGS. 6A-6E can be implemented to form the elements disclosed herein. Unless otherwise noted, components of FIGS. 6A-6E can be the same as or generally similar to the like components disclosed herein, such as those shown in FIGS. 4A and 4B.

FIG. 6A is a cross-sectional view showing a non-conductive region 22 and a cavity 28 formed in the non-conductive region 22. The cavity 28 can extend at least partially through a thickness of the non-conductive region 22. In some embodiments, the cavity 28 can extend completely through the thickness of the non-conductive region 22. A barrier layer 26 can be provided in the cavity 28. The barrier layer 26 can have a thickness or width in the nano meter scale. For example, the barrier layer 26 can have a thickness in a range of 10 nm to 50 nm, 20 nm to 50 nm, 10 nm to 40 nm, or 20 nm to 40 nm. In some embodiments, a dielectric layer (not shown) may be disposed between the barrier layer 26 and the non-conductive region 22.

FIG. 6B is a cross-sectional view showing the non-conductive region 22, the barrier layer 26, and a conductive material 60 disposed in the cavity 28. In some embodiments, when the conductive material 60 is provided, there may be an excess portion of the conductive material 60 over the non-conductive region 22. Such excess portion can be removed by way of a removing process, such as a chemical mechanical polishing (CMP) process.

In FIG. 6C, at least a portion of the conductive material 60 is removed. In some embodiments, a portion of the conductive material 60 that contacts the barrier layer 26 can be removed to define a void 62 and a center portion 30. For example, the portion of the conductive material 60 can be removed by way of etching (e.g., a selective etching process).

In FIG. 6D, an edge portion 32 can be provided in the void 62. The void 62 may be at least partially or completely filled with a material of the edge portion 32. The material of the edge portion 32 can be the same as or different from the conductive material 60 of the center portion 30. The edge portion 32 can have a thickness or width in the micron scale. The thickness of the edge portion 32 can vary based at least in part on the size of the conductive feature 24. For example, the thickness of the edge portion can be in a range of 1 μm to 5 μm, 2 μm to 5 μm, 1 μm to 4 μm, or 2 μm to 4 μm. In some embodiments, the filling material may be formed by electroless, atomic layer deposition method (ALD) or other known methods. After the filling step for forming the edge portion 32, the excess portion may be removed by a mechanical planarization method. An edge portion void may be formed as needed.

In FIG. 6E, the element 40 is prepared for direct bonding. For example, at least a contact surface 22a of the non-conductive region 22 can be polished, for example, by way of CMP, to have a surface roughness of less than 15 Å rms, less than 10 Å rms, or less than 5 Å rms. Dishing may occur during the polishing process such that surfaces 30a, 32a of the center portion 30 and the edge portion 32 are recessed below the contact surface 22a. In some embodiments, the surfaces 30a, 32a of the center portion 30 and the edge portion 32 can be intentionally recessed in accordance of embodiments disclosed herein. For example, the surface 32a can be recessed so as to have the surface 32a below the surface 30a.

Figures 7A, 7B:
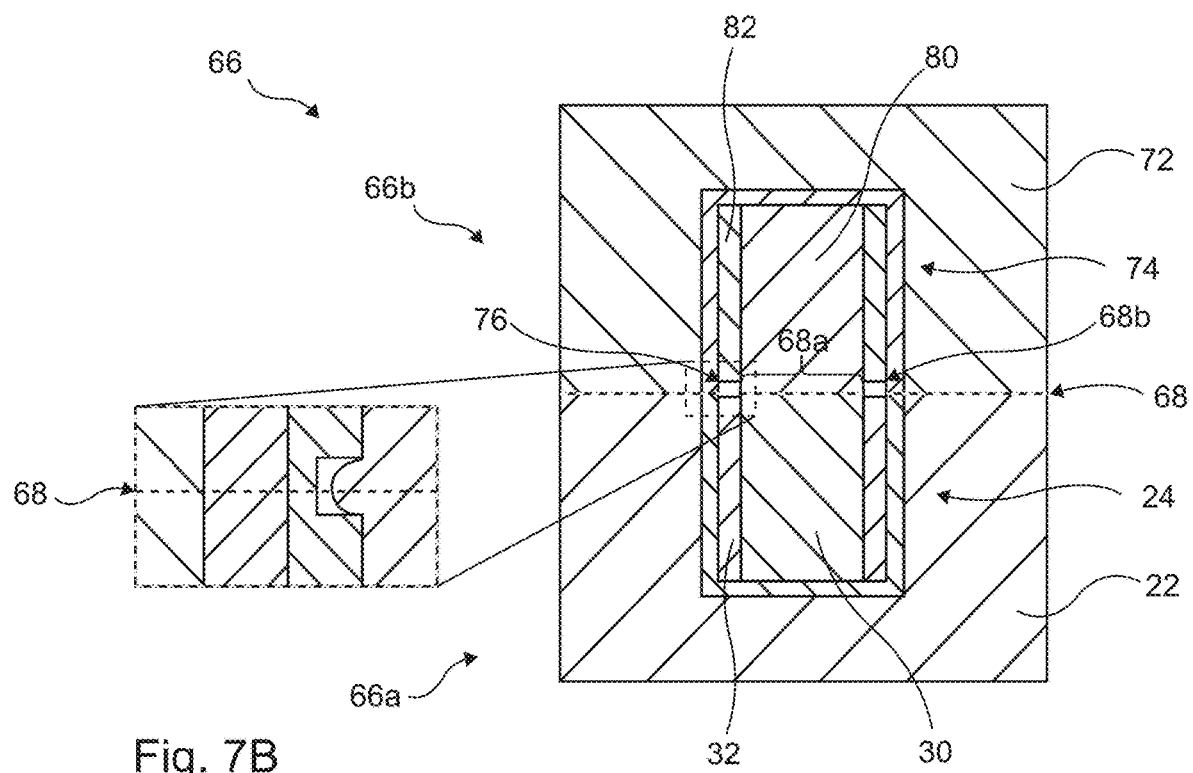
FIG. 7A shows a cross-sectional side view of at least a portion of a bonded structure including a first element and a second element.
FIG. 7B is a close up view of a portion of the bonded structure shown in FIG. 7A.

An element (a first element) in accordance with various embodiments disclosed herein can be bonded to another element (a second element) to form a bonded structure. FIG. 7A shows a cross-sectional side view of at least a portion of a bonded structure 66 including a first element 66a and a second element 66b. FIG. 7B is a close up view of a portion of the bonded structure 66 shown in FIG. 7A. In some embodiments, the first element 66a and the second element 66b can be directly bonded to one another along a bonding interface 68 without an intervening adhesive. For example, nonconductive regions 22, 72 of the first and second elements 66a, 66b can be directly bonded to one another at room temperature, and conductive features 24, 74 of the first and second elements 66a, 66b can be directly bonded to one another after the nonconductive regions 22, 72 of the first and second elements 66a, 66b are bonded. Bonding the conductive features 24, 74 of the first and second elements 66a, 66b can comprise an annealing process. The conductive feature 24 can include a center portion 30 and an edge portion 32, and the conductive feature 74 can include a center portion 80 and an edge portion 82. A portion of the bonding interface 68 between the center portion 30 and the center portion 80 can be referred to as a center region 68a of the bonding interface 68. A portion of the bonding interface 68 between the edge portion 32 and the edge portion 82 can be referred to as an edge region 68b of the bonding interface 68.

In some embodiments, the bonded structure 66 can include a signature that indicates the use of a conductive feature of an embodiment disclosed herein. In some embodiments, the bonded structure 66 can include voids 76 (e.g., micro-voids) that are indicative of the conductive feature according to embodiments disclosed herein. The micro-voids can be defined as voids having an average dimension (e.g., a linear lateral dimension or width) equal to or less than 300 nm, 100 nm or 80 nm, for example, an average dimension in a range of 10 nm to 300 nm, 10 nm to 100 nm, or 10 nm to 80 nm. In terms of lateral area observed in a cross-section, the micro-voids can have an average area in a range of 70 nm$^2$ to 70000 nm$^2$, 100 nm$^2$ to 7000 nm$^2$, or 100 nm$^2$ to 700 nm$^2$. For example, there may be more voids 76 per area or void concentration at or near the edge region 68b of the bonding interface 68 than at or near the center region 68a. For example, there may be more voids 76 at or near the edge region 68b of the bonding interface 68 than at or near the center region 68a. Near the edge region 68b can be a portion of the bonded edge portions 32, 82 within about 500 nm into the thicknesses of the bonded edge portions 32, 82 from the edge region 68b of the bonding interface 68, and near the center region 68b can be a portion of the bonded center portions 30, 80 within about 500 nm into the thicknesses of the bonded center portions 30, 80 from the center region 68a of the bonding interface 68. The voids can move around in these portions within 500 nm from the bonding interface 68 during the annealing process. The difference in a number of voids at or near the center region 68a and a number of voids at or near the edge region 68b can be detected by taking a side cross-section of the bonded structure 66 as shown in FIG. 7A, and inspecting the side cross-section. In, some embodiments, the voids present at or near the edge region 68b of the bonding interface 68 can be smaller than the voids present at or near the center region 68a.

Though the two elements (the first and second element 66a, 66b) are precisely aligned in the illustrated bonded structure 66 in FIG. 7A, the first and second elements 66a, 66b may be misaligned. As a result of the misalignment of the first and second elements 66a, 66b, at least a portion of the edge portion 32 may be aligned with a portion of the center portion 80. In such a bonded structure with misaligned elements, the above characterized structure of more voids 76 per area or void concentration at or near edge region 68b of the bonding interface 68 than the center region 68a can be maintained.

In some embodiments, as shown in FIG. 7B, the bonded center portions 30, 80 can expand or bulge into a portion (e.g., the void 76) in the edge region 68b between the edge portion 32 and the edge portion 82 resulting in a mixture of the materials of the center portions 30, 80, and the edge portions 32, 82. The mixture of the materials can be an indication of a presence of a recess of the edge portion 32, 82 relative to a contact surface of the element 66a, 66b that is deeper than a recess of the center portion 30, 80 relative to the contact surface of the element 66a, 66b. The mixture of the materials can be an indication that the center portion 30, 80 has a CTE that is greater than a CTE of the edge portion 32, 82, and/or that the edge portion 32, 82 was recessed below the center portion 30, 80 before annealing.

Though FIGS. 7A and 7B show the bonded structure 66 that includes two identical or generally similar elements 66a, 66b, a bonded structure can include two or more different elements. For example, the bonded structure can include an element in accordance with one embodiment and another element in accordance with another embodiment. The bonded conductive features can have different structure based at least in part on the material, the size and shape of the conductive structure, the annealing temperature, and/or the annealing duration.

FIG. 8A is a cross-sectional side view of conductive features 24, 90 prior to annealing. The conductive features 24, 90 can be parts of elements that are directly bonded along a bonding interface 68 between corresponding nonconductive regions (not shown in FIG. 8A). The conductive feature 24 can include a center portion 30 and an edge portion 32. In some embodiments, the conductive feature 24 can be disposed at least partially between portions of a barrier layer 26. The conductive feature 90 can be disposed at least partially between portions of a barrier layer 92. The edge portion 32 is recessed relative to the bonding interface 68 between the corresponding non-conductive regions by a depth d2.

FIG. 8B is a cross-sectional side view of the conductive features 24, 90 after annealing at a first temperature for a first duration. The center portion 30 of the conductive feature 24 and the conductive feature 90 can expand and be bonded together. The edge portion 32 can expand and a depth d3 between the edge portion 32 and the bonding interface 68 can be smaller than the depth d2 prior to bonding shown in FIG. 8A. The temperature and/or the duration of the annealing can impact the expansion of the center portion 30, edge portion 32, and/or the conductive feature 90.

FIG. 8C is a cross-sectional side view of the conductive features 24, 90 after annealing at a second temperature for a second duration. The second temperature and/or the second duration can be greater than the first temperature and/or the first duration. The edge portion 32 can expand and a depth d4 between the edge portion 32 and the bonding interface 68 can be smaller than the depth d3 of FIG. 8B.

FIG. 8D is a cross-sectional side view of the conductive features 24, 90 after annealing at a third temperature for a third duration. The third temperature and/or the third duration can be greater than the second temperature and/or the second duration. The edge portion 32 can expand and a depth d5 between the edge portion 32 and the bonding interface 68 can be smaller than the depth d4 of FIG. 8C. Depending on the temperature and the duration, the edge portion 32 can be in contact and bonded with the conductive feature 90.

FIG. 8E is a cross-sectional side view of the conductive features 24, 90 after annealing at a fourth temperature for a fourth duration. In some embodiments, the interface between the edge portion 32 and the conductive feature 90 can include voids 94 (e.g., micro-voids or nano-voids). For example, the edge portion 32 can expand so as to form filaments or a comb shape with varying heights depending at least in part on the material of the edge portion 32, the fourth temperature, and/or the fourth duration.

FIG. 9A is a cross-sectional side view of conductive features 24, 24' prior to annealing. The conductive features 24, 24' can be parts of elements that are directly bonded along a bonding interface 68 between corresponding non-conductive regions. The conductive features 24, 24' can have the same or generally similar structures. The conductive feature 24 can include a center portion 30 and an edge portion 32. The conductive feature 24' can include a center portion 30' and an edge portion 32'. In some embodiments, the conductive feature 24, 24' can be disposed at least partially between a barrier layer 26, 26'. The edge portion 32 is recessed relative to the bonding interface 68 between the corresponding non-conductive regions by a depth d2.

FIG. 9B is a cross-sectional side view of the conductive features 24, 24' after annealing at a first temperature for a first duration. The center portion 30 of the conductive feature 24 and the center portion 30' of the conductive feature 24' can expand and be bonded together. The edge portion 32 can expand and a depth d6 between the edge portion 32 and the bonding interface 68 can be smaller than the depth d2 prior to bonding shown in FIG. 9A. The temperature and/or the duration of the annealing can impact the expansion of the center portions 30, 30', and/or edge portions 32, 32'.

FIG. 9C is a cross-sectional side view of the conductive features 24, 24' after annealing at a second temperature for a second duration. The second temperature and/or the second duration can be greater than the first temperature and/or the first duration. The edge portion 32 can expand and a depth d7 between the edge portion 32 and the bonding interface 68 can be smaller than the depth d6 of FIG. 8B. The center portions 30, 30' can expand and at least partially fill a gap between the edge portions 32, 32'.

FIG. 9D is a cross-sectional side view of the conductive features 24, 24' after annealing at a third temperature for a third duration. The third temperature and/or the third duration can be greater than the second temperature and/or the second duration. The edge portion 32 can expand and a depth d8 between the edge portion 32 and the bonding interface 68 can be smaller than the depth d7 of FIG. 9C. The center portions 30, 30' can expand and at least partially fill a gap between the edge portions 32, 32'. In some other embodiments, depending on the temperature and the duration the edge portion 32 can be in contact and bonded with the edge portion 32'.

FIG. 9E is a cross-sectional side view of the conductive features 24, 24' after annealing at a fourth temperature for a fourth duration. In some embodiments, the interface between the edge portion 32 and the edge portion 24' can include voids 94 (e.g., micro-voids or nano-voids). For example, the edge portion(s) 32, 32' can expand so as to form filaments or a comb shape with varying heights depending at least in part on the material of the edge portion 32, 32', the fourth temperature, and/or the fourth duration.

In one aspect, a bonded structure is disclosed. The bonded structure can include a first element that has a first non-conductive region and a first conductive feature, and a second element that has a second non-conductive region and a second conductive feature. The second element is bonded to the first element along a bonding interface such that the second non-conductive region is directly bonded to the first non-conductive region along a non-conductive interface and the second conductive feature is directly bonded to the first conductive feature along a conductive interface. The conductive interface between the first and second conductive features has a center region and an edge region laterally between the center region and the non-conductive interface between the first and second non-conductive regions. In a side cross-section of the bonded structure, there are more voids at or near the edge region than at or near the center region.

In one embodiment, the first non-conductive region has a cavity extending at least partially through a thickness of the first non-conductive region. The first conductive feature can be formed in the cavity. The first conductive feature can include a center portion and an edge portion disposed between a sidewall of the cavity and the center portion. The center portion can have a first coefficient of thermal expansion. The edge portion can have a second coefficient of thermal expansion that is different from the first coefficient of thermal expansion. The center portion and the edge portion can include the same material with different crystal orientations. The center portion and the edge portion can include different materials. The edge region can include filaments of a material of the edge portion of the first conductive feature. The center portion can be partially disposed between the edge portion of the first conductive feature and the edge portion of the second conductive feature. The second non-conductive region can have a second cavity extending at least partially through a thickness of the second non-conductive region, and the second conductive feature can be formed in the second cavity. The second conductive feature can include a second center portion and a second edge portion disposed between a second sidewall of the second cavity and the second center portion.

In one embodiment, the voids at or near the center region have an average void size greater than an average void size of the voids at or near the edge region.

In one aspect, an element having a bonding surface is disclosed. The element can include a non-conductive region that has a cavity extending at least partially through a thickness of the non-conductive region from a contact surface of the non-conductive region. The contact surface at least partially define the bonding surface of the element. The element can include a conductive feature formed in the cavity. The conductive feature includes a center portion and an edge portion that is disposed between a sidewall of the cavity and the center portion. The center portion has a first coefficient of thermal expansion. The edge portion has a second coefficient of thermal expansion different from the first coefficient of thermal expansion. The center portion is recessed relative to the contact surface of the non-conductive region by a first depth. The edge portion is recessed relative to the contact surface of the non-conductive region by a second depth different from the first depth.

In one embodiment, the contact surface has a surface structure prepared for direct bonding.

In one embodiment, the first coefficient of thermal expansion is greater than the second coefficient of thermal expansion. The center portion and the edge portion can include the same material with different crystal orientations. The center portion and the edge portion can include different materials.

In one embodiment, the second depth is greater than the first depth.

In one embodiment, the element further includes a barrier layer disposed between the edge portion and the sidewall of the cavity. The barrier layer can be configured to prevent or reduce diffusion of the conductive feature into the non-conductive region.

In one aspect, an element having a bonding surface is disclosed. The element can include a non-conductive region having a cavity extending at least partially through a thickness of the non-conductive region from a contact surface of the non-conductive region. The contact surface at least partially defines the bonding surface of the element. The element can include a conductive feature that is formed in the cavity. The conductive feature includes a center portion and an edge portion that is disposed between a sidewall of the cavity and the center portion. The center portion has a first coefficient of thermal expansion. The edge portion has a second coefficient of thermal expansion different from the first coefficient of thermal expansion. The center portion is recessed relative to the contact surface of the non-conductive region by a first depth. The edge portion is recessed relative to the contact surface of the non-conductive region by a second depth. The first coefficient of thermal expansion is at least 5% greater than the second coefficient of thermal expansion.

In one embodiment, the contact surface has a surface structure prepared for direct bonding.

In one embodiment, the center portion and the edge portion include the same material with different crystal orientations.

In one embodiment, the center portion and the edge portion include different materials.

In one embodiment, the second depth is greater than the first depth.

In one embodiment, the element further includes a barrier layer disposed between the edge portion and the sidewall of the cavity.

In one aspect, a method of forming a conductive feature in a cavity in a non-conductive region of an element is disclosed. The cavity extends at least partially through a thickness of the non-conductive region from a contact surface of the non-conductive region. The method can include providing a first conductive material in the cavity, removing at least a portion of the first conductive material from the cavity, providing a second conductive material in the removed portion of the first conductive material, and recessing the first conductive material and the second conductive material relative to the contact surface of the non-conductive region.

In one embodiment, the first conductive material is recessed relative to the contact surface of the non-conductive region by a first depth and the second conductive material is recessed relative to the contact surface of the non-conductive region by a second depth different from the first depth. The second conductive material can be positioned between the first conductive material and a sidewall of the cavity. The first conductive material can include copper or cobalt alloy. The second depth can be greater than the first depth.

In one embodiment, the first material has a first coefficient of thermal expansion and the second material has second coefficient of thermal expansion. The first coefficient of thermal expansion can be greater than the second coefficient of thermal expansion.

In one embodiment, recessing the first conductive material and the second conductive material relative to the contact surface of the non-conductive region comprises polishing the non-conductive region and the conductive feature.

In one embodiment, the method further includes providing a barrier layer on inner surface of the cavity.

In one aspect, a method of forming a bonded structure is disclosed. The method can include providing a first element and directly bonding a bonding surface of a second element to the bonding surface of the first element. The first element includes a non-conductive region having a cavity extending at least partially through a thickness of the non-conductive region from a contact surface of the non-conductive region. The contact surface at least partially defines a bonding surface of the first element. The first element includes a conductive feature formed in the cavity and at least partially defining the bonding surface of the first element. The conductive feature includes a center portion and an edge portion that is disposed between a sidewall of the cavity and the center portion. The center portion has a first coefficient of thermal expansion. The edge portion has a second coefficient of thermal expansion different from the first coefficient of thermal expansion. The center portion is recessed relative to the contact surface of the non-conductive region by a first depth. The edge portion is recessed relative to the contact surface of the non-conductive region by a second depth different from the first depth.

In one embodiment, directly bonding the bonding surfaces of the first and second elements includes directly bonding a non-conductive region of a second element to the non-conductive region of the first element without an intervening adhesive, and directly bonding a conductive feature of the second element to the conductive feature of the first element without an intervening adhesive.

In one embodiment, directly bonding the conductive feature of the second element to the conductive feature of the first element includes annealing the conductive features.

In one embodiment, the first coefficient of thermal expansion is greater than the second coefficient of thermal expansion. The center portion and the edge portion can include the same material with different crystal orientations. The center portion and the edge portion can include different materials.

In one embodiment, the second depth is greater than the first depth.

In one embodiment, conductive feature of the second element includes a center portion and an edge portion. The center portion of the second element can have a third coefficient of thermal expansion. The edge portion of the second element can have a fourth coefficient of thermal expansion. The third coefficient of thermal expansion can be greater than the fourth coefficient of thermal expansion.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
   a first element having a first non-conductive region and a first conductive feature; and
   a second element having a second non-conductive region and a second conductive feature, the second element being bonded to the first element along a bonding interface such that the second non-conductive region is directly bonded to the first non-conductive region along a non-conductive interface and the second conductive feature is directly bonded to the first conductive feature along a conductive interface,
   wherein the conductive interface between the first and second conductive features has a center region and an edge region laterally between the center region and the non-conductive interface between the first and second non-conductive regions, wherein in a side cross-section of the bonded structure, there are more voids at or near the edge region than at or near the center region.

2. The bonded structure of claim 1, wherein the first non-conductive region has a cavity extending at least partially through a thickness of the first non-conductive region, and the first conductive feature is formed in the cavity, the first conductive feature including a center portion and an edge portion disposed between a sidewall of the cavity and the center portion.

3. The bonded structure of claim 2, wherein the center portion has a first coefficient of thermal expansion, the edge portion has a second coefficient of thermal expansion different from the first coefficient of thermal expansion.

4. The bonded structure of claim 3, wherein the center portion and the edge portion include the same material with different crystal orientations.

5. The bonded structure of claim 3, wherein the center portion and the edge portion include different materials.

6. The bonded structure of claim 2, wherein the edge region includes filaments of a material of the edge portion of the first conductive feature.

7. The bonded structure of claim 2, wherein the center portion is partially disposed between the edge portion of the first conductive feature and the edge portion of the second conductive feature.

8. The bonded structure of claim 2, wherein the second non-conductive region has a second cavity extending at least partially through a thickness of the second non-conductive region, and the second conductive feature is formed in the second cavity, the second conductive feature including a second center portion and a second edge portion disposed between a second sidewall of the second cavity and the second center portion.

9. The bonded structure of claim 1, wherein the voids at or near the center region have an average void size greater than an average void size of the voids at or near the edge region.

10. An element having a bonding surface comprising:
    a non-conductive region having a cavity extending at least partially through a thickness of the non-conductive region from a contact surface of the non-conductive region, the contact surface at least partially defining the bonding surface of the element; and
    a conductive feature formed in the cavity, the conductive feature including a center portion and an edge portion disposed between a sidewall of the cavity and the center portion, the center portion having a first coefficient of thermal expansion, the edge portion having a second coefficient of thermal expansion different from the first coefficient of thermal expansion, the center portion recessed relative to the contact surface of the non-conductive region by a first depth, the edge portion recessed relative to the contact surface of the non-conductive region by a second depth different from the first depth.

11. The element of claim 10, wherein the contact surface has a surface structure prepared for direct bonding.

12. The element of claim 10, wherein the first coefficient of thermal expansion is greater than the second coefficient of thermal expansion, and the center portion and the edge portion include the same material with different crystal orientations.

13. The element of claim 10, wherein the first coefficient of thermal expansion is greater than the second coefficient of thermal expansion, and the center portion and the edge portion include different materials.

14. The element of claim 10, wherein the second depth is greater than the first depth.

15. The element of claim 10, further comprising a barrier layer disposed between the edge portion and the sidewall of the cavity, the barrier layer configured to prevent or reduce diffusion of the conductive feature into the non-conductive region.

16. An element having a bonding surface, the element comprising:
- a non-conductive region having a cavity extending at least partially through a thickness of the non-conductive region from a contact surface of the non-conductive region, the contact surface at least partially defining the bonding surface of the element; and
- a conductive feature formed in the cavity, the conductive feature including a center portion and an edge portion disposed between a sidewall of the cavity and the center portion, the center portion having a first coefficient of thermal expansion, the edge portion having a second coefficient of thermal expansion different from the first coefficient of thermal expansion, the center portion recessed relative to the contact surface of the non-conductive region by a first depth, the edge portion recessed relative to the contact surface of the non-conductive region by a second depth,
- wherein the first coefficient of thermal expansion is at least 5% greater than the second coefficient of thermal expansion.

17. The element of claim 16, wherein the contact surface has a surface structure prepared for direct bonding.

18. The element of claim 16, wherein the center portion and the edge portion include the same material with different crystal orientations.

19. The element of claim 16, wherein the center portion and the edge portion include different materials.

20. The element of claim 16, wherein the second depth is greater than the first depth.

* * * * *